United States Patent
Kanagawa

[19]

[11] Patent Number: 5,892,719
[45] Date of Patent: Apr. 6, 1999

[54] REDUNDANCY CIRCUIT TECHNIQUE APPLIED DRAM OF MULTI-BIT I/O HAVING OVERLAID-DQ BUS

[75] Inventor: Naoaki Kanagawa, Yokohama, Japan

[73] Assignee: Kabushiki Kaisha Toshiba, Kawasaki, Japan

[21] Appl. No.: 997,536

[22] Filed: Dec. 23, 1997

[30] Foreign Application Priority Data

Dec. 27, 1996 [JP] Japan .................................. 8-349363

[51] Int. Cl.⁶ ............................................................ G11L 7/00
[52] U.S. Cl. .............................................. 365/200; 365/63
[58] Field of Search ........................................ 365/200, 190, 365/230.03, 63; 257/296

[56] References Cited

U.S. PATENT DOCUMENTS 5,303,199  4/1994  Ishihara et al. ............................ 365/200

Primary Examiner—Tan T. Nguyen
Attorney, Agent, or Firm—Banner & Witcoff, Ltd.

[57] ABSTRACT

There is provided a semiconductor memory device of a overlaid-DQ system having a column redundancy technique having high efficiency of replacing a defective address without largely increasing a chip size. Regarding DRAM of the overlaid-DQ bus type, in a metal line layer formed at an upper portion than bit lines, 256 pairs of DQ lines (DQ0 to DQ255) are formed in a form to be overlaid on the memory cell array. Each of spare circuits (a spare column, its sense amplifier (S/A), a pair of spare DQ lines (pair of SDQ lines SDQ0 to SDQ3)) is arranged per 64 pairs of DQ lines. Four sets of spare circuits may be structured as a column redundancy in connection with the 256 pairs of DQ lines, each set of spare circuits may be structured in connection with 65 pairs of DQ lines.

22 Claims, 18 Drawing Sheets

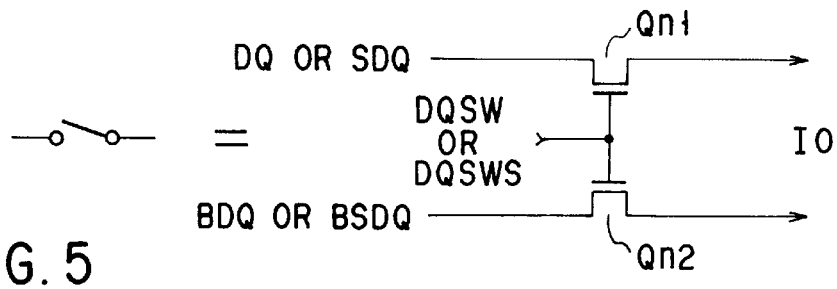
FIG. 5
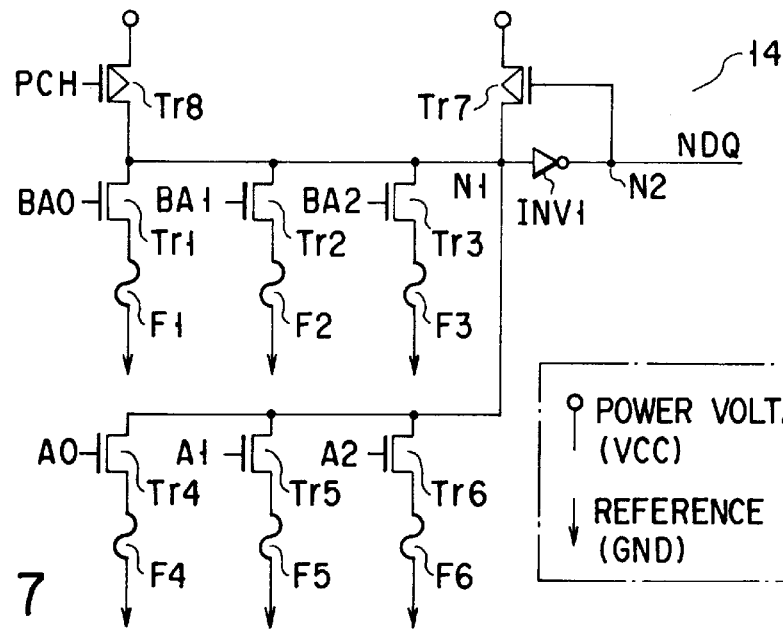
FIG. 6
FIG. 7
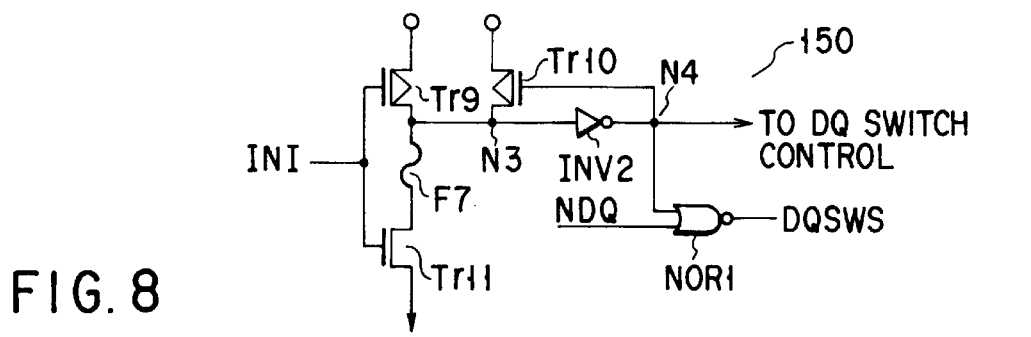
FIG. 8

REDUNDANCY CIRCUIT TECHNIQUE APPLIED DRAM OF MULTI-BIT I/O HAVING OVERLAID-DQ BUS

BACKGROUND OF THE INVENTION

The present invention relates to an architecture of a memory circuit and particularly to a redundancy circuit technique, which is applied to DRAM of a multi-bit I/O, having an overlaid-DQ bus.

In recent years, various kinds of information devices such as a personal computer, an office computer, etc, are used. Particularly, in the personal computer, it is required that data of motion pictures and voice be processed at high speed. However, as compared with the high speed operation of a central processing unit of information device, the speed-up of the operation of a general memory device has not been advanced yet. In order to solve this problem, various kinds of architectures such as synchronous DRAM, RAMBUS DRAM are used to speed up the operation of the general memory device (particularly, DRAM). However, it is required that a data transfer rate is largely ensured without using such a special architecture.

In the process of the general DRAM of a 16M bit generation, two metal line layers, including a bit selection line and a global data line (DQ line), are generally used.

FIG. 1 is a block diagram showing one example of DRAM of 16M bit generation. In the figure, DRAM is partially extracted from a chip of DRAM. Two memory cells (MA1, MA2) are arranged, and a sense amplifier circuit section (S/A), which comprises a plurality of sense amplifiers, is provided at both sides of S/A. A line to which data is transferred from a bit line BL (BBL) is a DQ (BDQ) line. BBL and BL are signal lines showing a complementary relationship therebetween. BDQ and DQ are signal lines showing a complementary relationship therebetween. Row decoders for selecting a word line WL are provided in a row direction. The following explains a case of accessing to data of memory cell MC selected by WL0 and BL0. At this time, BBL0 is a dummy bit line to which a reference voltage is supplied.

To read data of memory cell MC, a voltage (data of MC) transmitted to BL0 and a voltage (reference voltage) transmitted to BBL0 are supplied to a sense amplifier S/A2 connected to BL0, BBL0. Next, data of the memory cell MC is sensed by S/A2 to be amplified. After amplifying data sufficiently, a column selection line CSL is set to be high level, and a transistor of a transfer gate is turned on. Thereby, data is transferred to DQ1 and BDQ1.

Thus, the conventional structure of DRAM is formed such that the bit line BL and the DQ line are intersected each other to have a predetermined connecting point of the sense amplifier circuit section S/A. To realize the multi-bit I/O by use of the arrangement of the DQ line shown in FIG. 1, data must be read from a large number of pairs of DQ lines so that each S/A connected to each pair of DQ lines is operated. As a result, power consumption of the chip is increases.

In consideration of the above-mentioned problem, there is used a system in which the DQ lines are arranged in a direction parallel to the bit lines BL as an architecture of DRAM having multi-bit I/O, that is, the overlaid-DQ system (overlaid DQ bus architecture).

FIG. 2 is a circuit diagram explaining the system structure of the overlaid-DQ system. The overlaid-DQ system is suitable for a memory device for reading/writing a large amount of data at one time. FIG. 2 shows a case of accessing to data of memory cell MC selected by WL0 and BL0. At this time, BBL0 is a dummy bit line to which a reference voltage is supplied.

To read data of the memory cell MC, the voltage (data of MC) transmitted to BL0 and the voltage (reference voltage) transmitted to BBL0 are supplied to the sense amplifier S/A2 connected to BL0, BBL0. Next, data of the memory cell MC is sensed by S/A2 to be amplified. After amplifying data sufficiently, the transfer gate is set to be a conductive state by a column switch signal CSW2. Thereby, data is transferred to DQ1 and BDQ1.

For example, regarding the memory cell selected by WL0, in the sense amplifier circuit section S/A belonging to the memory cell array MA1, only sense amplifiers in S/A2 or S/A1 are operated, and CSW2 (or CSW1) is set to be in an active level. Thereby, data of each memory cell can be read to the large number of pairs of DQ lines (DQ0, BDQ0 to DQn, BDQn).

In other words, the sense amplifiers in S/A1 are operated and CSW1 is set to be in the active level. Then, among the memory cells selected by the arbitrary word line WL in the memory cell array MA1, data of each memory cell connected to bit lines of even number such as BL1, BBL1 is read to each pair of DQ lines.

Also, the sense amplifiers in S/A2 are operated and CSW2 is set to be in the active level. Then, among the memory cells selected by the arbitrary word line WL in the memory cell array MA1, data of each memory cell connected to bit lines of odd number such as BL0, BBL0 is read to each pair of DQ lines.

Moreover, the sense amplifiers in S/A3 are operated and CSW3 is set to be in the active level. Then, among the memory cells selected by the arbitrary word line WL in the memory cell array MA2, data of each memory cell connected to bit lines of odd number such as BL2, BBL2 is read to each pair of DQ lines.

Also, the sense amplifiers in S/A4 are operated and CSW4 is set to be in the active level. Then, among the memory cells selected by the arbitrary word line WL in the memory cell array MA2, data of each memory cell connected to bit lines of even number such as BL3, BBL3 is read to each pair of DQ lines.

As compared with the structure of the multi-bit I/O shown in FIG. 1, the structure shown in FIG. 2 can restrain an increase in consumption power. Also, in the overlaid-DQ system, a large number of DQ lines are arranged in a form that they are overlaid above the cell array. As a result, there can be realized the structure in which the size of the chip is not increased.

However, even in the memory device using the above-explained overlaid-DQ system, variations of the process occur in the DQ lines, the sense amplifiers, and the memory cells. Therefore, it can be considered that possibility that the memory cell will be defective is the same as the case of the general DRAM. However, the redundancy technique for replacing the defective cell with a redundancy cell has not been optimized yet.

BRIEF SUMMARY OF THE INVENTION

An object of the present invention is to provide a semiconductor memory device having a redundancy technique suitable for an overlaid-DQ system of multi-bit IO in which spare columns can be effectively used as controlling an occupation rate of an area relating to the spare columns to a minimum.

The object can be achieved by the following structure.

Specifically, according to the present invention, there is provided a semiconductor memory device comprising:

a memory cell array having memory cells arranged in a matrix form in row and column line directions;

spare columns having spare memory cells arranged in the memory cell array;

a decoder for decoding an address for reading and writing data of the memory cell array;

a plurality of pairs of data lines, having the same direction as the row line direction at an upper portion of the memory cell array and having a first metal line layer placed at an upper position, for electrically connected to the memory cell array;

a plurality of signal lines for transmitting signals of a predetermined number pairs of data lines having an address partially common to the plurality of pairs of data lines;

a first pair of parallel lines arranged in the row line direction to guide the predetermined number of pairs of data lines, the first pair of parallel lines having a second metal line layer placed at an upper position than the row line and a lower position than the first metal line layer;

a pair of spare data lines having the same direction as the row line direction at the upper portion of the spare columns and the first metal line layer, the pair of spare data lines electrically connected to the spare memory cell to be replaced with the pairs of data lines;

a second pair of parallel lines having the metal line layer to guide the pairs of spare data lines to the each pair of signal lines;

a control circuit for storing an address of a specific pair of data lines for transmitting defective data in the memory cell array so that an outer address signal is input, the control circuit for transmitting a control signal for selecting any one of the pairs of data lines, corresponding to the outer address signal, and the pairs of spare data; and a switch circuit electrically connected between the memory cell array and the pairs of signal lines in response to the outer address signal by controlling the selection of the pairs of spare data corresponding to the outer address having no replacement with the pairs of spare data lines and the pairs of data lines corresponding to the outer address replaced with the pairs of data lines based on the control signal.

According to the present invention, the switch circuit is controlled, so that the signal of selected data lines is sent to as a signal of spare data lines, which do not replace data lines corresponding to the outer address, or as a signal of spare data lines, which replace data lines corresponding to the outer address.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a circuit diagram showing the relationship between one switch circuit of FIG. 4 and a control signal;

FIG. 6 is a view showing an address signal in a decode operation of the pairs of DQ lines;

FIG. 7 is a first circuit diagram, which is necessary to use the spare columns;

FIG. 8 is a second circuit diagram, which is necessary to use the spare columns;

DETAILED DESCRIPTION OF THE INVENTION

Figure 1:
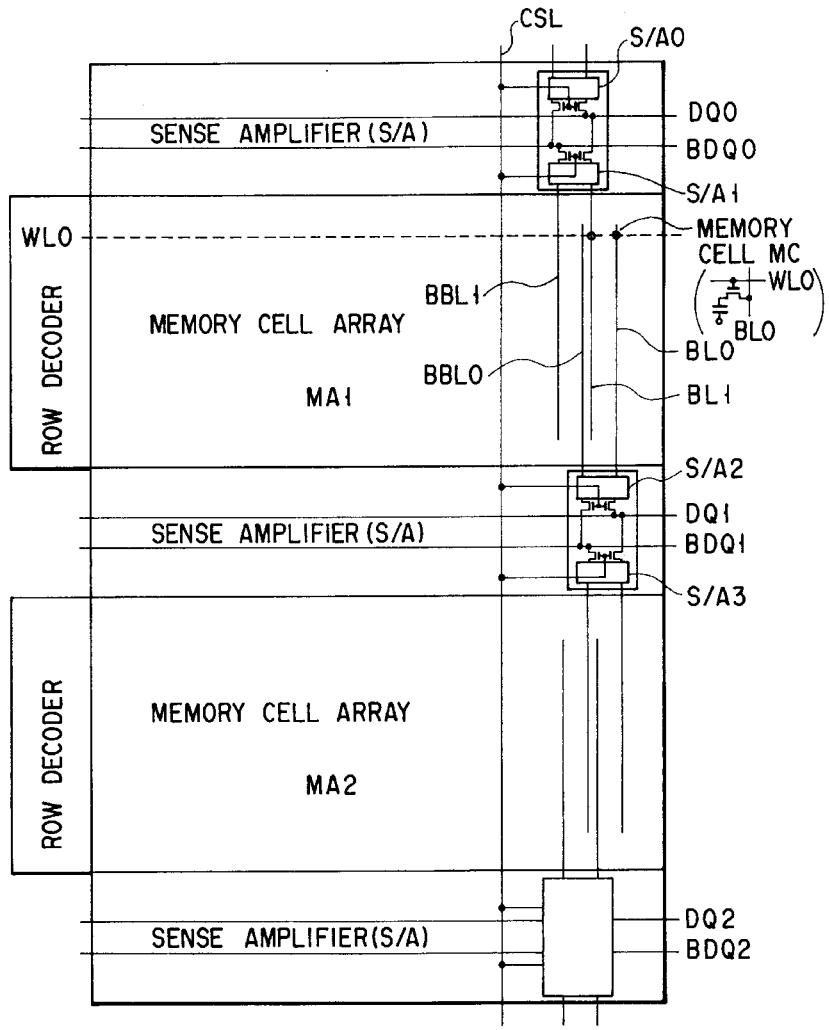
FIG. 1 is a block diagram showing one example of the conventional structure of a 16M bit DRAM generation.
Figure 2:
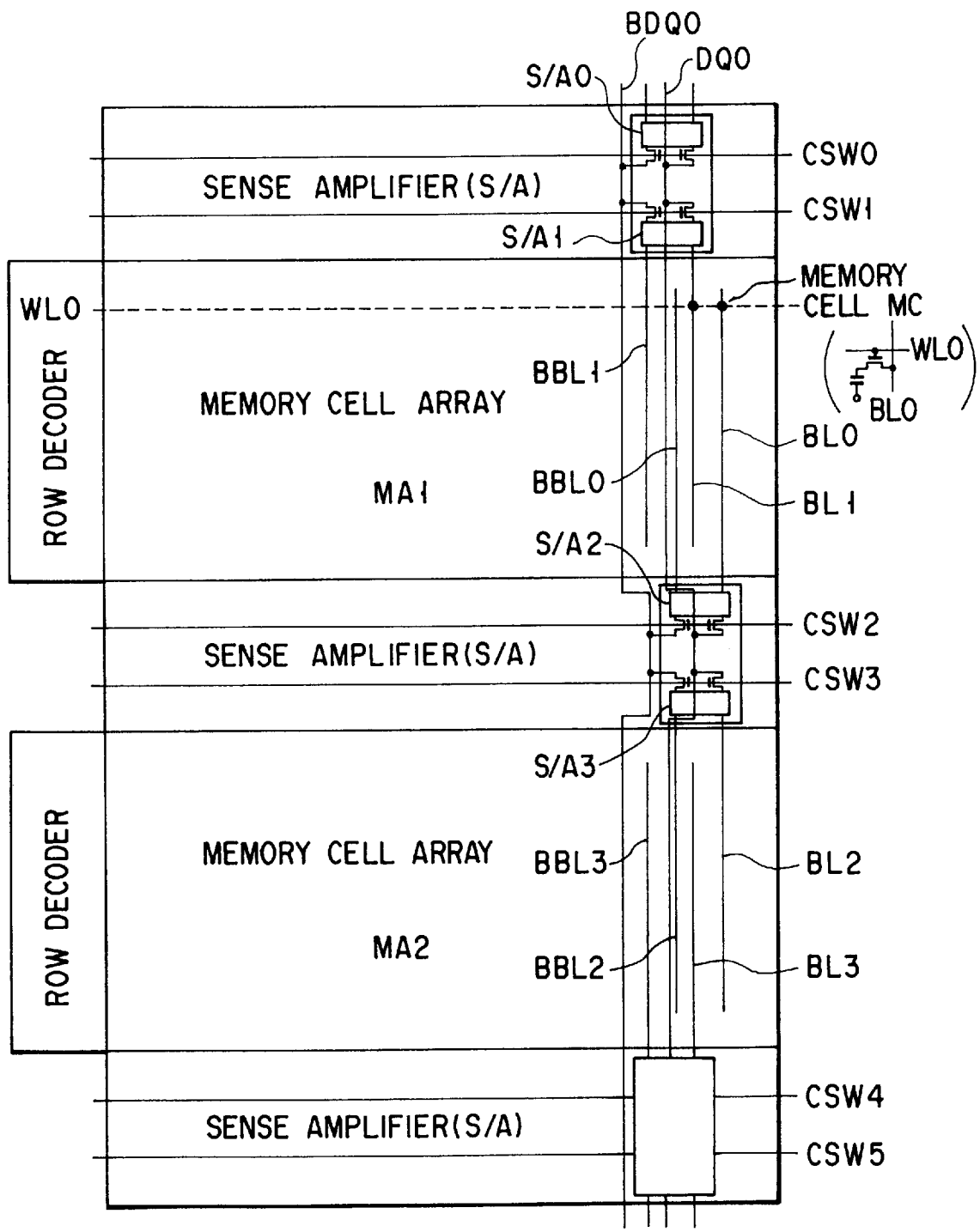
FIG. 2 is a circuit diagram showing the structure of an overlaid-DQ system.
Figure 3:
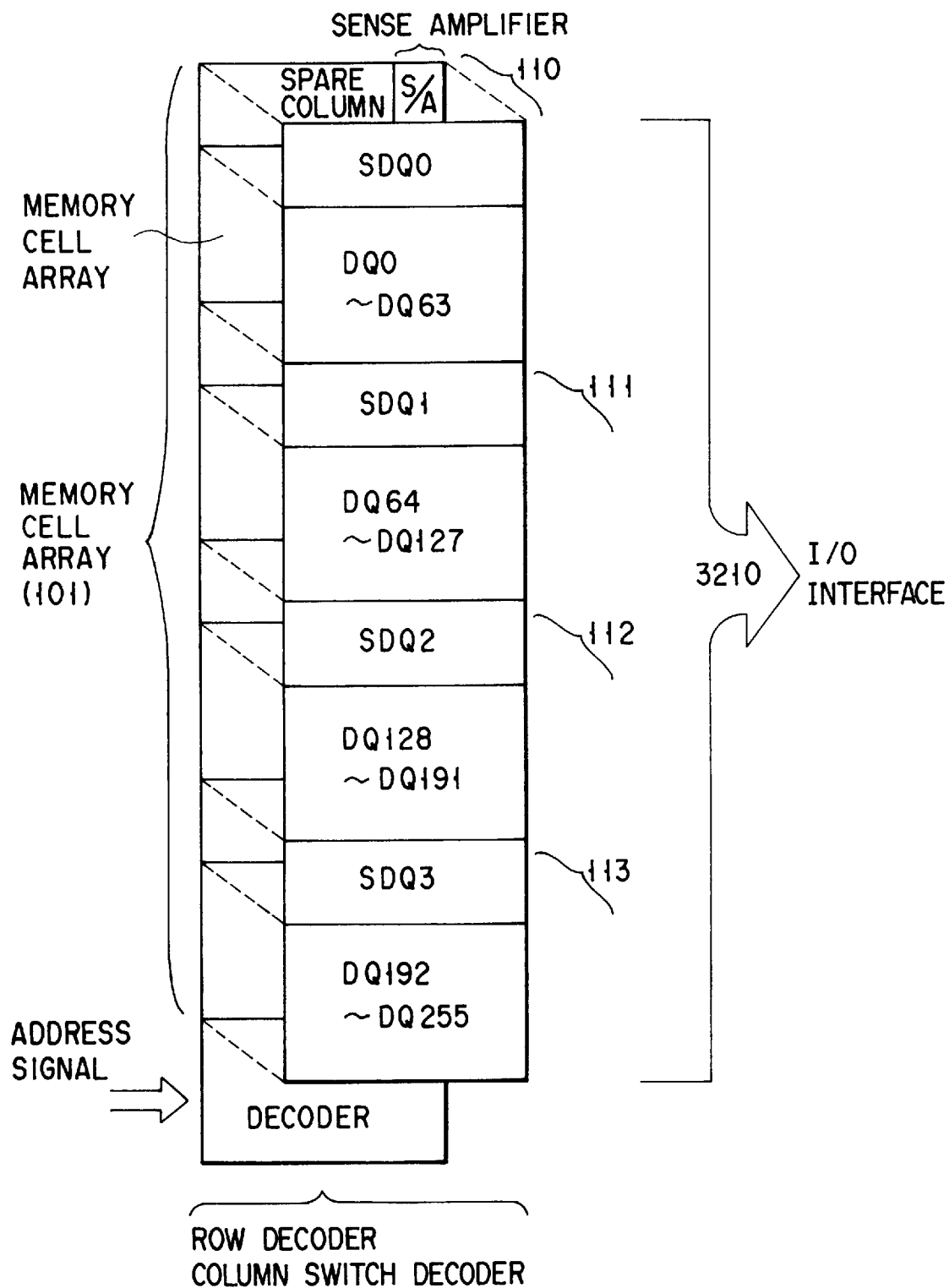
FIG. 3 is a block diagram showing the arrangement of the spare columns in a semiconductor memory device of an overlaid-DQ system according to a first embodiment of the present invention.

FIG. 3 is a block diagram showing the arrangement of the spare columns in a semiconductor memory device of an overlaid-DQ system according to a first embodiment of the present invention. In this block diagram, one memory cell array and a sense amplifier of one side are extracted from a plurality of memory cell arrays of a DRAM chip structure and the blocks of the sense amplifiers. In other words, FIG. 3 is a block conceptional view showing that a memory cell array MA1 of FIG. 2 and S/A2 arrangements of a sense amplifier circuit section are extracted.

In FIG. 3, there is formed a memory cell array 101 in which memory cells are arranged in a matrix form in the directions of row and column lines. The memory cell array 101 includes spare columns. A decoder decodes an address for reading and writing data of the memory cell array. In a metallic wire layer formed at an upper portion than the column lines (bit lines), 256 pairs of DQ lines (DQ0 to DQ255) are formed in a form that they are overlaid on the layout of the memory cell array 101. Each of spare circuits 110 to 113 (each having a spare column, formed of memory cell column for one column, its sense amplifier (S/A), a pair of spare DQ lines (pair of SDQ lines: SDQ0 to SDQ3)) is arranged per 64 pairs of DQ lines. In this case, one set of pairs of DQ lines, which has eight pairs of DQ lines, relates to one IO line. In other words, predetermined data relating to each pair of DQ lines is transmitted to 32 IO lines. These 32 IO lines are connected to an I/O interface.

In this embodiment, one pair per 64 pairs of DQ lines can be replaced with a pair of spare DQ lines SDQ. In other words, a pair of spare DQ lines SDQ0 is provided with respect to the pairs of DQ lines DQ0 to DQ63, and a pair of spare DQ lines SDQ1 is provided with respect to the pairs of DQ lines DQ64 to DQ127. Moreover, a pair of spare DQ lines SDQ2 is provided with respect to the pairs of DQ lines DQ128 to DQ191, and a pair of spare DQ lines SDQ3 is provided with respect to the pairs of DQ lines DQ192 to DQ255.

Figure 4:
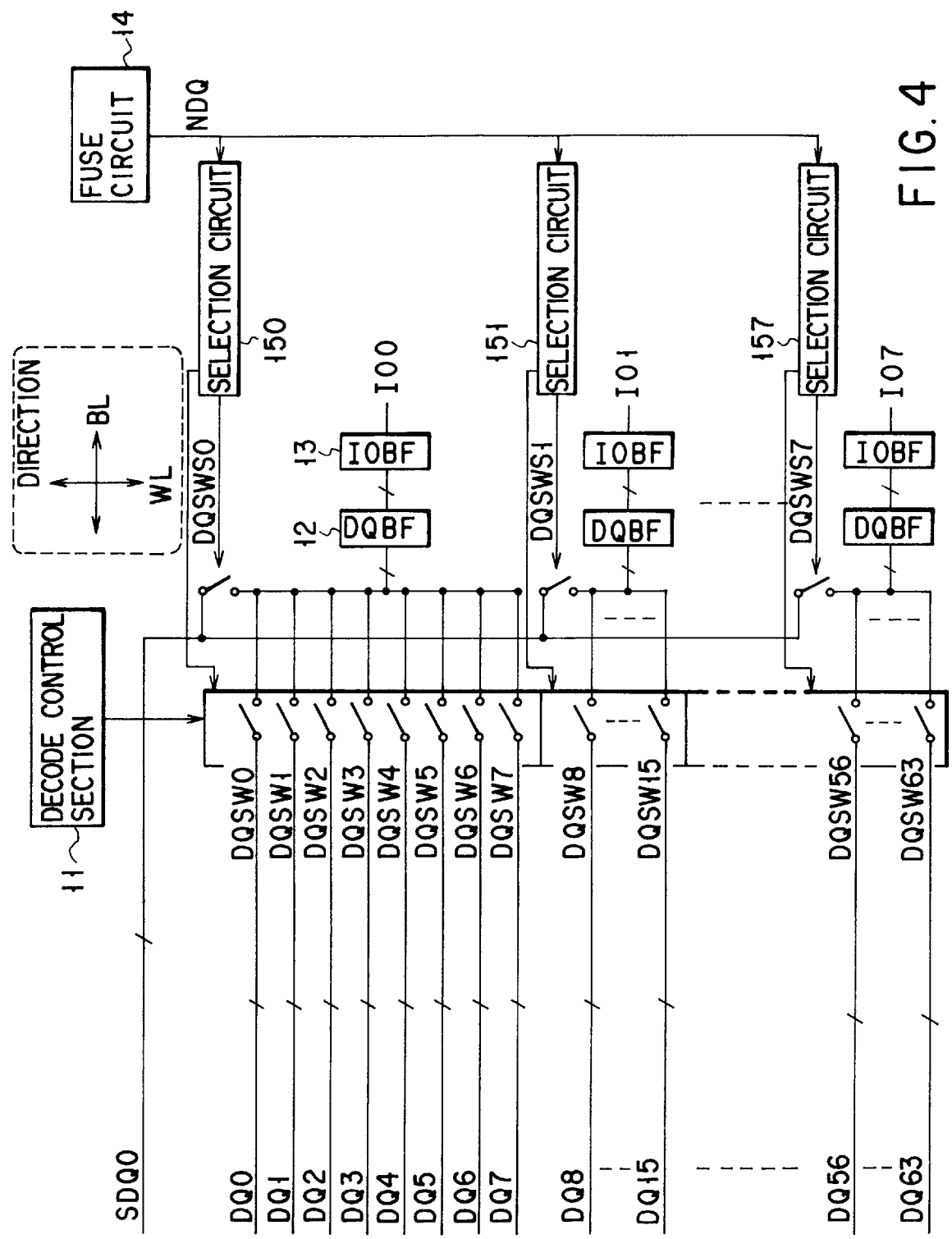
FIG. 4 is a basic conceptional view of the invention in which 64 pairs of DQ lines and one SDQ line are extracted in connection with FIG. 3.

FIG. 4 is a basic conceptional view of the present invention in which 64 pairs of DQ lines (DQ0 to DQ63), and one pair of DQ lines as a spare are extracted. In this figure, just for simple explanation, each pair of DQ lines and SDQ lines is described by one line.

In this figure, 64 pairs of DQ lines are divided into blocks each having 8 pairs of DQ lines, that is, DQ0 to DQ7, DQ8 to DQ15, . . . DQ56 to DQ63. Then, one of 8 pairs of DQ lines is selected by a decode control section 11. That is, the pair of DQ lines is selected by decoding signals of lower three bit positions of the column address (FIG. 6). Data of each of the selected pair of DQ lines is transferred to each of pairs IO lines IO0 to IO7 through each DQ buffer circuit 12 and each I/O buffer circuit 13.

In this embodiment, a spare column (SDQ), which is replaced with data of a defective address, is structured such that one pair of DQ lines, which corresponds to an arbitrary one of eight pairs of IO lines IO0 to IO7, can be replaced.

More specifically, a fuse circuit 14, which stores one detective column address every 64 pairs of DQ lines relating to 8 IO lines, is provided. Moreover, selection circuits 150 to 157 are provided every 8 pairs of DQ lines relating to one IO line. The selection circuits 150 to 157 detect to which IO lines of 8 pairs of DQ lines the pair of the DQ lines, which actually corresponds to the defective column address, is connected.

DQSW0 to DQSW63 and DQSWS0 to DQSWS7 are control signals to a switch circuit, which is formed of a MOS transistor. Then, the relationship between one switch circuit and the control signals is shown in FIG. 5. Qn1 and Qn2 are N-channel MOS transistors. In this case, the N-channel MOS transistors are set to be in a signal logic level "1" (high level) to be turned on, and to be in a signal logic level "0" (low level) to be turned off.

Thus, the DQ lines are formed at an upper layer than the bit lines (not shown). Also, the metallic lines (not shown) of the word lines are formed at an upper layer than the bit lines. It is assumed that the metallic line layer relating to DQ lines is formed of two layers. In the second layer of the metallic line layer, the pairs of DQ lines, which are parallel to the direction of the bit lines BL, and the pairs of SDQ lines are laid out to intersect in the direction of the word lines WL of the lower layer. Then, the pairs of DQ lines, which are parallel to the direction of the word lines WL, and the pairs of SDQ lines are laid out in the first layer of the metallic line layer. The first layer may have the same layer as the metallic line layer of the word lines for the following reason:

Specifically, the pairs of DQ lines and the pairs of the SDQ lines are formed on the selection circuit of the pairs of the DQ lines where the metallic lines of the word lines are not laid out.

In the circuit of FIG. 4, one of the pairs of DQ lines DQ0 to DQ7 is selected and data is transmitted. The pairs of DQ lines DQ0 to DQ7 are decoded by signals of lower three bit positions of the column address, that is, A0 to A2, to be selected. The decode table is shown in FIG. 6. In this case, the high level of the logic circuit is expressed by "1", and the low level thereof is expressed by "0." In FIG. 6, BA0, BA1, BA2 are reverse signals of A0, A1, A2.

Next, the following will explain one example of the circuit, which is necessary to use the fuse circuit 14.

FIG. 7 shows the specific circuit diagram of the fuse circuit 14. As shown in FIG. 4, one fuse circuit 14 is prepared per 8 pairs of IO lines (IO0 to IO7). FIG. 8 shows a selection circuit 150, which is provided every 8 pairs of DQ lines (selection circuits 151 to 157 has the same structure as the circuit 150).

In FIGS. 7 and 8, Tr1 to Tr6, and Tr11 are N-channel MOS transistors, Tr7 to Tr10 are P-channel MOS transistors. INV1 and INV2 are CMOS inverters, and NOR1 is an NOR gate for two inputs of the CMOS structure. N1 to N4 are nodes.

The circuit of FIG. 7 is controlled with respect to an address signal (A1 to A2) of FIG. 6. Fuses of the fuse circuit are cut such that the address signal corresponding to the defective address can be detected. This can be specifically explained as follows:

(5-1) If all fuses are in a non-blown state, a PCH signal for controlling precharge is set to "0". Then, node N1 is sufficiently charged to be in a "1" state. Since all fuses F1 to F6 are in a non-blown state, node N1 is changed from "1" to "0" even if any address signal is supplied. As a result, node N2 is set to be in a "1" state, and NDQ is also set to be in a "1" state.

(5-2) If fuses F4, F5, F6 are cut, the PCH signal is set to "0." Then, node N1 is sufficiently charged to be in a "1" state. Next, when address signal (A0="1", A1="1", A2="1", BA0="0", BA1="0", and BA2="0") are given, a certain extent of time is required until node N1 is changed from "1" to "0" since fuses F4, F5, F6 are cut. Since node N2 is set to be in a "0" state until the address is given, Tr7 is turned on. Then, until the address is given and node N1 is changed from "1" to "0", node N2 is maintained to be in a "0" state by Tr7 and INV1. Therefore, NDQ is set to be in a "0" state.

FIG. 8 shows a logic circuit, which is formed every 8 pairs of DQ lines.

First, an INI is a signal whose level is changed from "0" to "1" when power is supplied to the chip. However, "0" state holding time is a fixed period of time. It is assumed that time is set to $t_{0hold}$. This can be specifically explained as follows:

(6-1) If F7 is not cut, node N3 is in a "0" state, and node N4 is in a "1" state after $t_{0hold}$. In this case, the output of gate NOR1 is "0" even if NDQ is in a level "0" or "1", and DQSWS (any one of DQSWS0 to DQSWS7 in FIG. 4) is in a "0" state (OFF).

(6-1) If F7 is cut, INI is in a "0" state when power is turned on. Then, node N3 is in a "1" state during $t_{0hold}$ (INI is in "0" state). Thereafter, even if INI is "1" and Tr9 is turned off, "1" data is latched in node N3 and "0" data is latched in node N4 since N4 is in a "0" state. As a result, DQSWS is in a "1" state (ON) when NDQ is in a "0" state.

Next, the following will specifically explain a data transfer operation with reference to FIGS. 7 and 8:

(1) Case in which no defective address exists:

For example, for transferring data to IO0 from DQ3 of FIG. 4, address signal (A0="1", A1="1", A2="0") are given, so that the signal DQW3 is activated and DQ3 and IO0 are connected. At this time, similarly, DQ11 and IO1, DQ19 and IO2, . . . DQ59 and IO7 are connected, respectively, so that data is transmitted.

In FIGS. 7 and 8, it is assumed that no defective address exists. Then, F1 to F7 are connected. As explained in item (5-1), NDQ is in 1 level, and DQSWS is in a "0" state (OFF) as explained in item (6-1).

DQSWS is a signal, which is input every 8 pairs of DQ lines. In FIG. 4, signals DQSWS0 to DQSWS7 are all active, and the spare column has no connecting relation with the IO line.

(2) Case in which a defective address exists and an address of a column where the defective address belongs to is designated:

For example, to replace DQ7 with SDQ0, the fuses of F1, F5, and F6 are cut. If the address for selecting DQ6 is input, the address signal (A0="0", A1="1", A2="1") are obtained and Tr1, Tr5, and Tr6 are turned on. However, since F1, F5, and F6 are cut, similar to the case of item (5-2), NDQ are set in a "0" state. As explained in item (6-2), since DQSWS is turned on, DQ6 is replaced with SDQ0.

Thus, if defective data is transferred to one of 64 pairs of DQ lines, the circuit of FIG. 8 designates which IO line is connected to the pair of DQ lines actually corresponding to the defective column address.

Also, by use of the circuit of FIG. 7, one pair of DQ lines can be designated from 8 pairs of DQ lines having a connecting relation with one IO line. Thereby, among 64 pairs of DQ lines, one pair of DQ lines, which transmits defective data, can be replaced with the pair of SDQ lines, which transmits normal data.

(3) Case in which a defective address exists but an address of a column, which is different from the defective column where the defective address belongs to is designated:

It is assumed that fuses F1, F5, and F6 of the above item (2) are cut. First, the PCH signal is set to "0". Then, node N1 is sufficiently charged to be in a "1" state. Next, in FIG. 7, it is assumed that address signal (A0="1", A1="1", A2="1" (corresponding to DQ7)) are applied. Since F4 is not cut and Tr4 is turned on, node N1 is in a "0" state and node N2 is in a "1" state. Thereby, NDQ is in a "1" state to be input to the gate NOR1 of FIG. 8. As a result, DQSWS0 is in a "0" state (OFF), and the pair of SDQ lines (spare column) is not switched.

Figure 9:
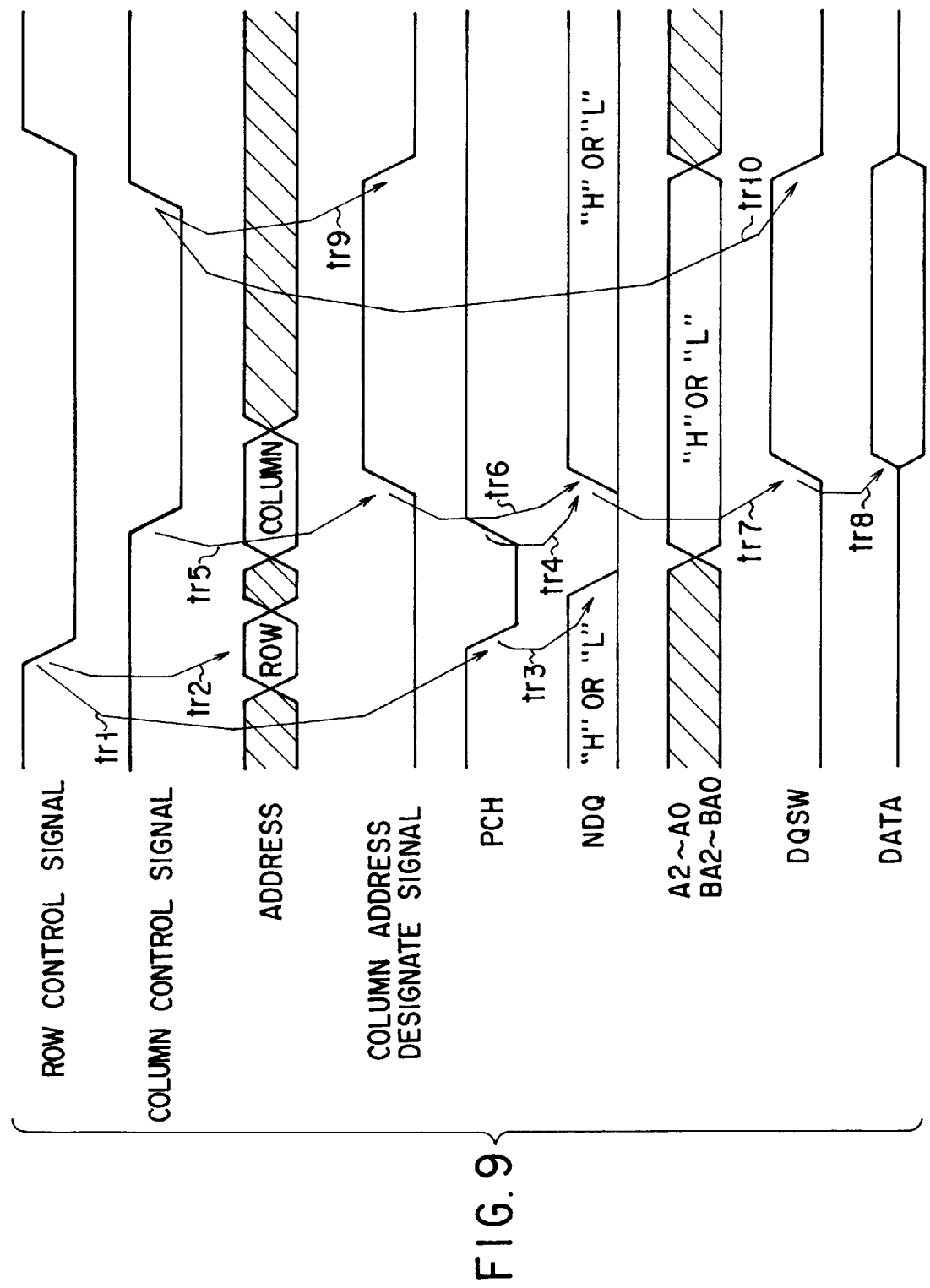
FIG. 9 is a timing chart showing data reading of a memory with respect to the address signal input based on the structure of FIGS. 7 and 8 of the first embodiment of the present invention.

FIG. 9 shows a timing chart of data reading of the memory in inputting the address signal by use of the structure of FIGS. 7 and 8 according to the first embodiment of the present invention. In this case, input of the normal address using no spare column is expressed. In the figure, the range shown by slanting lines is arbitrarily set to be in an "H" (high) level or an "L" (low) level. Then, tr1 is a trigger for controlling the PCH signal by a row control signal. tr2 is a trigger for fetching a row address by the row control signal. tr3 is a trigger for charging the fuse circuit by the PCH signal. tr4 is a trigger for stopping the charging of the fuse circuit by the PCH signal. tr5 is a trigger for generating a column address designate signal by a column control signal. tr6 is a trigger for designating the column address to control a signal NDQ. tr7 is a trigger for selecting a pair of DQ lines from the column address and the signal NDQ. tr8 is a trigger for outputting data by DQSW. tr9 is a trigger for falling the column address designate signal by the column control signal. tr10 is a trigger for falling DQSW by the column control signal.

In the actual memory of the overlaid DQ system, the number of IO lines amounts to the great number, such as 64, 128, 256. Therefore, the fuse circuit for decoding lower address bit positions, and the selection circuit (one fuse), which corresponds to each IO, are used. Thereby, the pair of DQ lines, which transfers defective data, can be designated and replaced with the pair of DQ lines, which transfers normal data. Such a structure can enhance the degree of freedom of the layout, and simplify the circuit structure.

The circuit for switching the pair of DQ lines to the pair of SDQ lines is formed in the periphery of the DQ buffer to which the end portion of the pair of DQ lines is connected.

The above-mentioned structure has the following features:

First, the spare columns are formed in the DRAM using the overlaid DQ system. Thereby, the replacement of defective data transfer can be performed, and the improvement of yield can be expected.

Second, if the defective address exists in forming the spare columns, the replacement of the defective address can be efficiently replaced. In other words, the spare circuits can be divisionally arranged to correspond to the address group in the replaceable range. As a result, various problems caused on the real chip such as a difference of the line delay can be reduced.

Third, the arrangement of fuses can be easily understood by the switching operation of the pair of DQ lines to the pair of the spare DQ line SDQ. Also, the degree of freedom of the layout of the spare circuit is high. Thereby, even if the rate of the address defectiveness is low, the small number of spare columns can be effectively used. As a result, there can be provided the redundancy technique, which is suitable to correspond to the overlaid-DQ system of the multi-bit I/O. This structure can contribute to the reduction of the size of the chip.

In this case, the switching operation of the pair of DQ lines to the pair of the lines SDQ is one example, and the addresses of the decode and the arrangement of the fuses can be easily changed.

Figure 10:
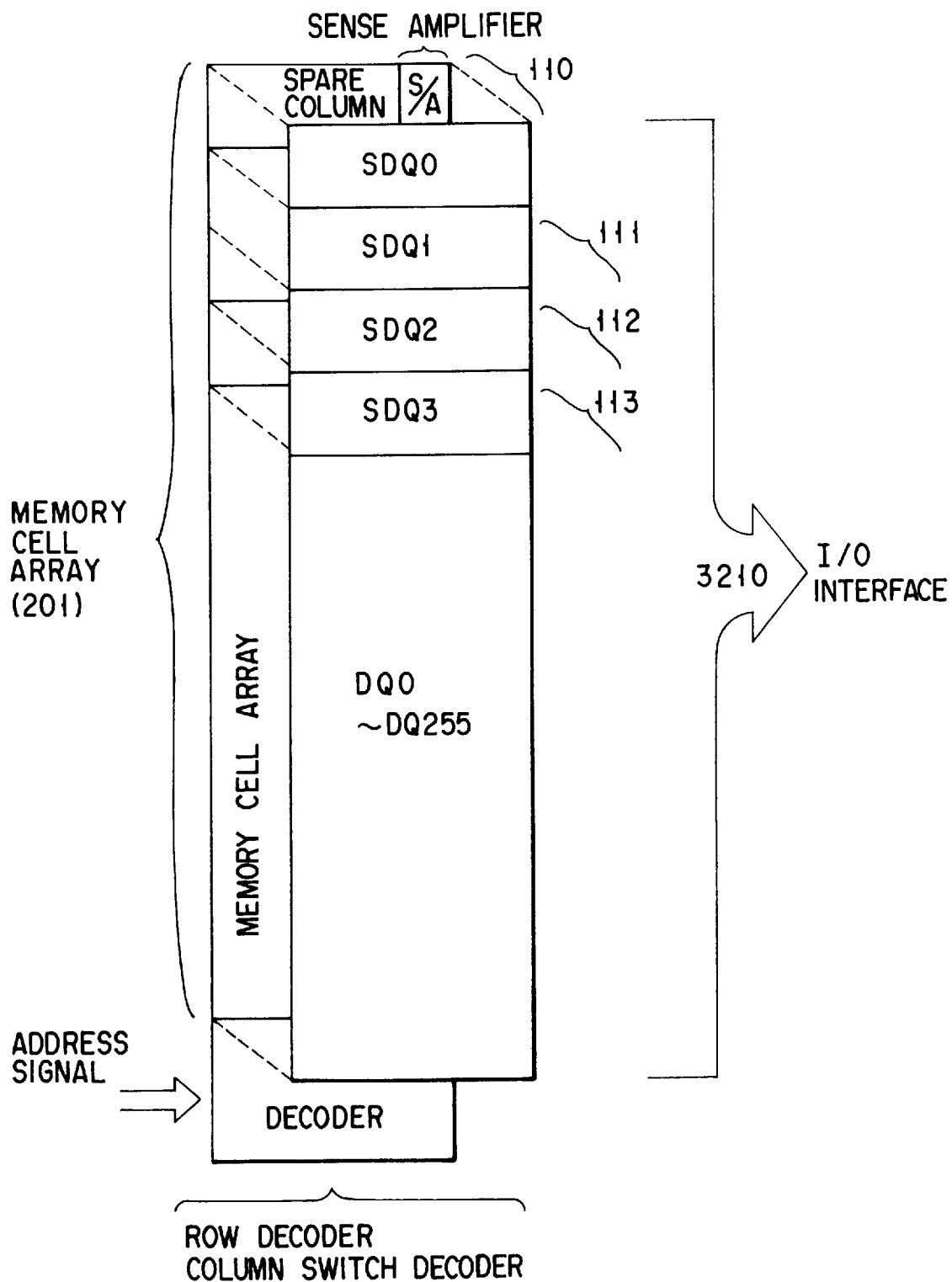
FIG. 10 is a block diagram showing the arrangement of the spare columns in the semiconductor memory device of the overlaid-DQ system according to a second embodiment of the present invention.

FIG. 10 is a block diagram showing the arrangement of the spare columns in the semiconductor memory device of the overlaid-DQ system according to a second embodiment of the present invention. Similar to FIG. 3, in this block diagram, one memory cell array and the sense amplifier of one side are extracted from the plurality of memory cell arrays of the DRAM chip structure and the blocks of the sense amplifiers.

In the metallic line layer above the bit lines, 256 pairs of DQ lines (DQ0 to DQ255) are formed in a form that they are overlaid on the layout of a memory cell array 201. Four sets of spare circuits 110 to 113 (each set including a spare column, formed of memory cell column for one column, its sense amplifier (S/A), a pair of spare DQ lines (pair of SDQ lines: SDQ0 to SDQ3)) correspond to 256 pairs of DQ lines in common.

In this embodiment, the defective columns can be replaced with only four pairs of spare DQ lines (SDQ0 to SDQ3) with respect to the pairs of DQ lines DQ0 to DQ255. As a result, even if the defective addresses concentrate in eight pairs of DQ lines with respect to one IO line, four pairs of DQ lines can be replaced with the spare columns. Similar to FIG. 3, a predetermined output relating to each pair of DQ lines is transmitted to 32 IO lines. 32 IO lines are connected to the I/O interface.

Figure 11:
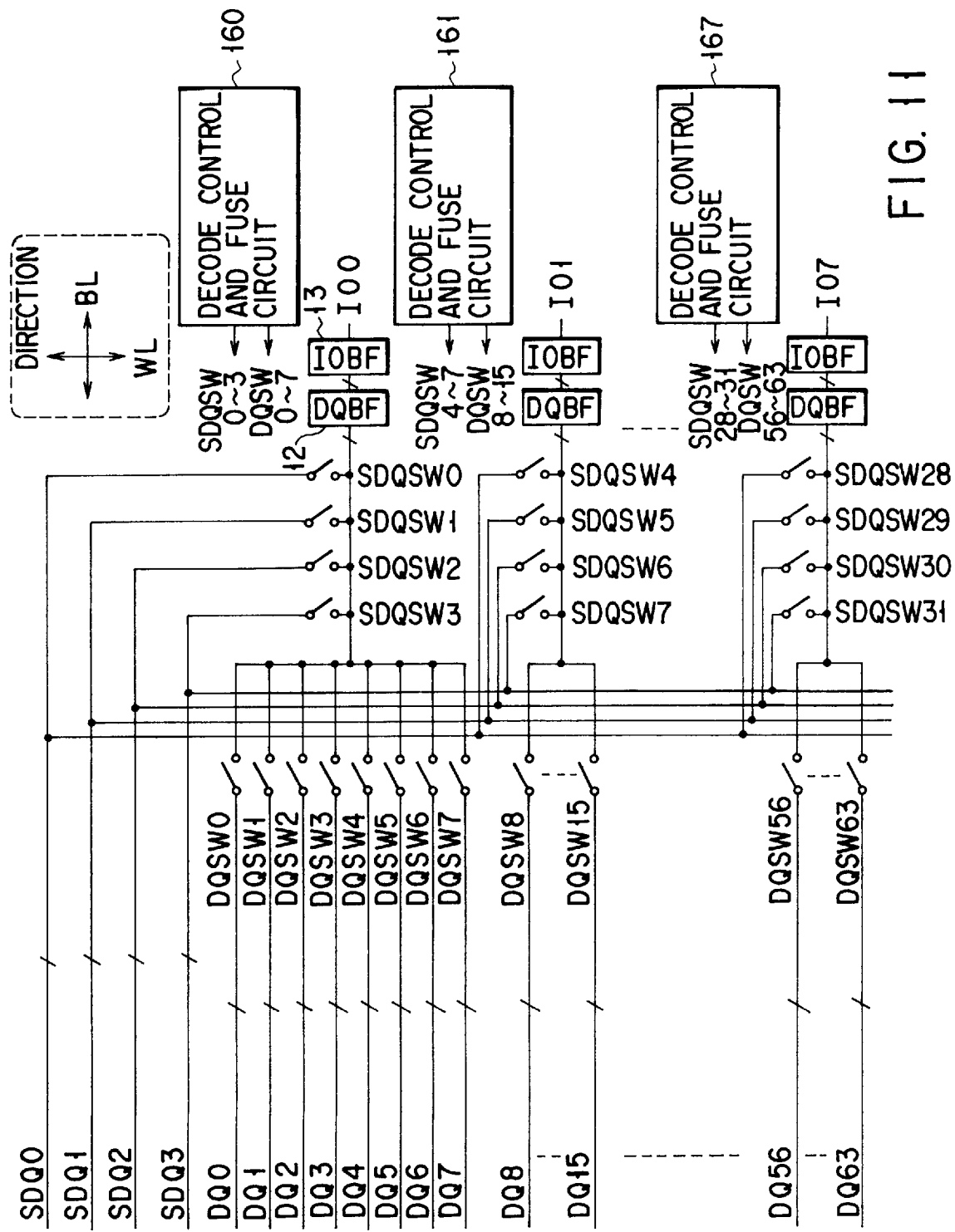
FIG. 11 is a basic conceptional view of the invention in which 64 pairs of DQ lines and four pairs of SDQ lines are extracted in connection with FIG. 10.

FIG. 11 is a conceptional view in which 64 pairs of DQ lines and four pairs of SDQ lines as spares are extracted in connection with FIG. 10. In this figure, just for simple explanation, each pair of DQ lines, bit lines, SDQ lines is described by one line.

In this figure, 64 pairs of DQ lines are divided into blocks each having 8 pairs of DQ lines, that is, DQ0 to DQ7, DQ8 to DQ15, . . . DQ56 to DQ63. The second embodiment differs from the first embodiment in the following point.

Specifically, all four pairs of SDQ lines are related to 256 pairs of DQ lines, and the replacement with the spare columns can be performed. In other words, even if the defective addresses concentrate in eight pairs of DQ lines with respect to one IO line, four pairs of DQ lines can be replaced with the spare columns.

It is assumed that the metallic line layer of the DQ lines is formed of two-layer metallic line layers provided above the bit lines (not shown). In the second layer of the metallic line layer, the pairs of DQ lines, which are parallel to the direction of the bit lines BL, and the pairs of SDQ lines are laid out to intersect in the direction of the word lines WL of the lower layer. Then, the pairs of DQ lines, which are parallel to the direction of the word lines WL, and the pairs of SDQ lines are laid out in the first layer of the metallic line layer. The first layer may have the same layer as the metallic line layer of the word lines for the following reason:

Specifically, the pairs of DQ lines and the pairs of the SDQ lines are formed on the selection circuit of the pairs of the DQ lines where the metallic lines of the word lines are not laid out.

In this embodiment, a decode control and fuse circuit, which is provided every eight pairs of DQ lines relating to one IO line, controls each signal of DQSW and SDQSW. In this figure, decode and fuse circuits 160 to 167 are described to control each signal of DQSW and SDQSW.

Generally, for example, for reading data from DQ3, DQSW3 is set to be in an active level, so that data of DQ3 is transmitted to IO0. In the second embodiment, four pairs of SDQ lines are designated by address signal A1 and A2 shown in FIG. 6.

For example, in order to turn on SDQSW1, the address signal (A1="1" and A2="0") are designated. If the address signal is designated, DQ2 or DQ3 is replaced with SDQ1. For example, if DQ3 is replaced with SDQ1, SDQSW1 is set to be in an active level in place of DQSW3 such that a switch element can be turned on. Similarly, SDQSW0 controls DQ0 or DQ1 to be replaced with SDQ0 in connection with DQSW0 and DQSW1. SDQSW2 controls DQ4 or DQ5 to be replaced with SDQ2 in connection with DQSW4 and DQSW5. Also, SDQSW3 controls DQ6 or DQ7 to be replaced with SDQ3 in connection with DQSW6 and DQSW7. Similarly, regarding each of IO1 to IO32, the same replacing control can be performed to correspond to the DQ line number of the corresponding eight pairs of DQ lines.

Figure 12:
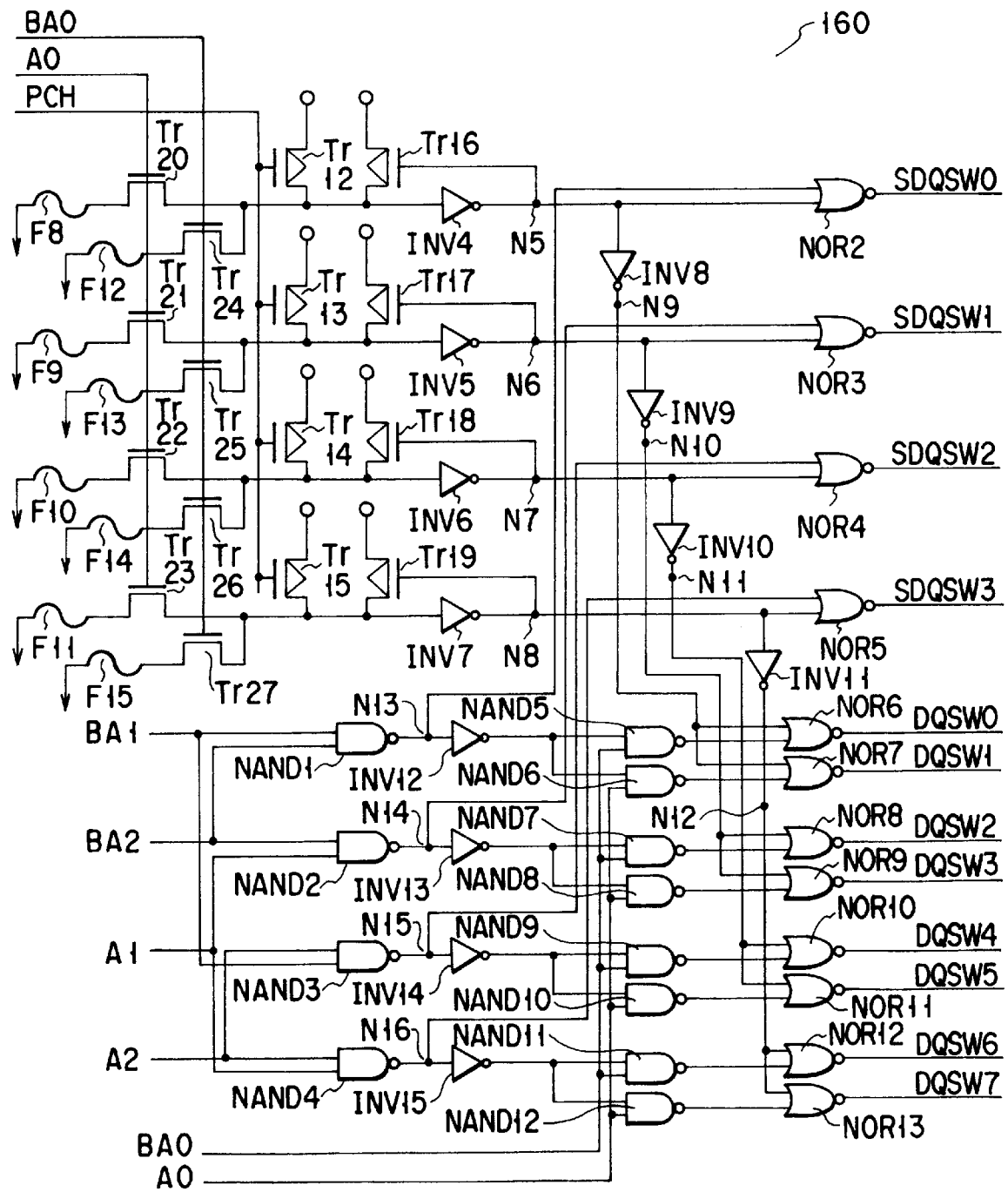
FIG. 12 is a circuit diagram showing one example of a decode control and fuse circuit, which is necessary to use the spare columns of the circuit of FIG. 11.

FIG. 12 is a circuit diagram showing one example of a decode control and fuse circuit (160), which is necessary to use the spare columns of the circuit of FIG. 11. The circuit structure is arranged for every eight pairs off DQ lines relating to one IO (in this case, the circuit structure corresponding to IO0 is typically shown). Tr12 to Tr19 are P-channel MOS transistors, Tr20 to Tr27 are N-channel MOS transistors, F8 to F15 are fuses, INV4 to INV15 are inverters, NAND1 to NAND 12 are NAND gates for two inputs, NOR2 to NOR13 are NOR gates for two inputs, and N5 to N16 are nodes of the circuit.

In this case, decode control and fuse circuits (160, 161, . . . ) with the switching operation of the pair of DQ lines to the pair of the lines SDQ is formed at the periphery of the DQ buffer where end portions of DQ lines are connected. This circuit is just one example, and the addresses of the decode and the arrangement of the fuses can be easily changed.

Next, the following will explain an operation of the circuit of FIG. 12.

Specifically, the following explanation is made in consideration of the replacement with SDQ. The following item (1) explains a case in which a pair of DQ lines is replaced with a pair of spare DQ lines. Also, the following item (2) explains a case in which a pair of DQ lines, which is different from the case of item (1), is replaced with a pair of spare DQ lines.

(1) Circuit operation for replacing DQ3 with SDQ1:

(a) If no defective address exists and an address signal corresponding to the pair of lines DQ3 is given, the address showing DQ3 is A0="1", A1="1", A2="0". Since the fuse is not cut, nodes N5 to N8 are "1" even if any address signal A0 is given. As a result, the outputs of logic gates NOR2 to OR5 are "0", and SDQSW0 to SDQSW3, serving as switch signals for SDQ, are in "0" state (OFF). Moreover, since node N6 is "1", node N10 is "0", and the signals are input to NOR8 and NOR9. Also, since the address signal is A1="1" and A2="0", only N14 is "0" among nodes N13 to N16. Moreover, the gate output of NAND 8 is "0" since the address signal is A0="1", and DQSW3 is in a "1" state (ON).

(b) Case in which the defective address belongs to DQ3 and is replaced with SDQ1, and an address signal corresponding to DQ3 is given:

In this case, F9 is cut. After the node of the drain side of Tr13 is charged by the PCH signal, the input of INV5 is maintained to be "1" since A0="1" and BA0="0". As a result, node N6 is "0." Next, since A1="1" and A2="0", only node N14 is "0" among nodes N13 to N16. Since node N6 and node N14 are "0", SDQSW1 1 is "1" (ON). Moreover, since node N14 is "0" and A="1", the output NAND 8 is "0." In this case, since node N6 is "0", node N10 is "1." As a result, the gate output of NOR9 is "0", SDQWS1 is "1" (ON) in place of DQSW3.

(c) Case in which the defective address belongs to DQ3 and is replaced with SDQ1, and an address signal, which is different from DQ3, is given:

Similar to the above case (a), the fuse F9 is cut. In this case, it is assumed that the address signal (A0="0", A1="0", A2="0") for selecting DQ0 is given. First, after the node of the drain side of Tr13 is charged by the PCH signal, A0="1" and BA0="0" and Tr25 is turned on, so that the output of INV5 is "1."

Next, since the address signal is A1="0", A2="0", only N13 is "0" among nodes N13 to N16. At this time, since N1 is "1" and N6 is "1", the gate output of NOR3 is "0." At this time, since node N13 is "0", the output gate of NAND5 is "0." At this time, since node N9 is "0", the gate output of NOR6 is "1."

Thus, SDQSW (e.g., SDQWS1) corresponding to the address is in the "0" level, and is not turned on when the fuse is cut. DQSW (e.g., SDQWS0) of the corresponding address is in the "1" level, and is turned on.

Figure 13:
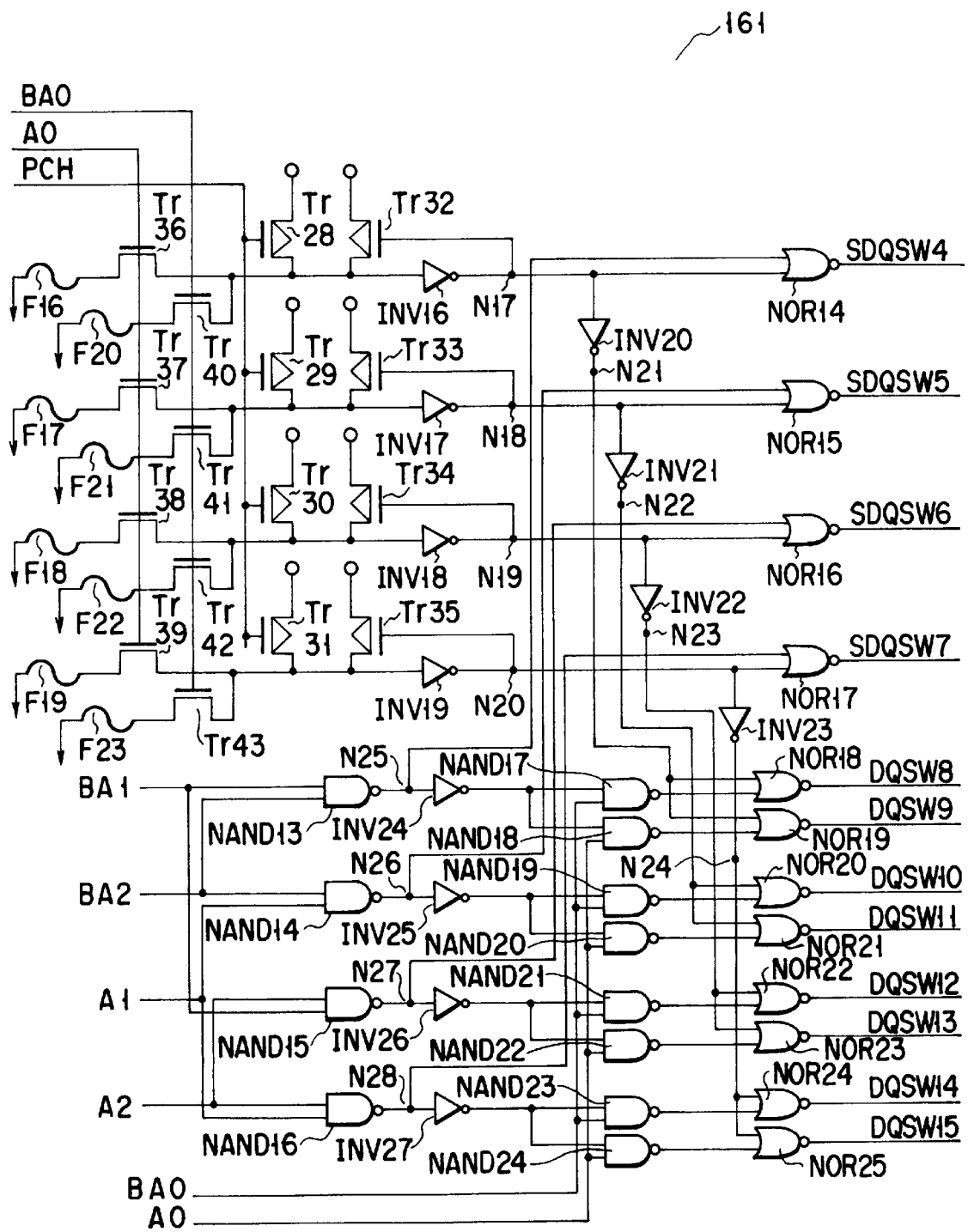
FIG. 13 is a circuit diagram showing one example of a decode control and fuse circuit, which is necessary to use the spare columns of the circuit of FIG. 11, which is arranged to correspond to IO lines different from FIG. 12.

(2) Circuit operation for replacing SDQ1 with DQ3, and DQ15 with SDQ3:

FIG. 13 shows a decode control and fuse circuit (161) arranged to correspond to IO1. The circuit structure is the same as the case of FIG. 12, and reference numerals are made different from the case of FIG. 12. Tr28 to Tr35 are P-channel MOS transistors, Tr36 to Tr43 are N-channel MOS transistors, F16 to F23 are fuses, INV16 to INV27 are inverters, NAND13 to NAND 24 are NAND gates for two inputs, NOR14 to NOR25 are NOR gates for two inputs, and N17 to N28 are nodes of the circuit. In this example of FIG. 13, fuse F19 is cut.

(a) Case in which each of the defective addresses belongs to each of DQ3 and DQ15, and the address signal corresponding to DQ3 is given:

As explained in item (1)–(a), DQSW3 is turned off and SDQSW1 is turned on. In FIG. 13, if the address signal (A0="1", A1="1", A2="0") corresponding to DQ3 is given, only N20 is "0" among node N17 to N20. Also, since the address signal is A1="1", A2="0", only N26 is "0" among nodes N25 to N28. As a result, the output of NOR17 is "0", and SDQS is not turned on.

Also, since node N20 is "0", node N24 is "1." However, since the gate outputs of NAND 23 and NAND 24 are "1", DQSW14 and DQSW15 are not "1" (ON). Therefore, in consideration of the point that only N26 is "0" among nodes N25 to N28 and A0=1, only the gate output of NAND20 is "0" among NAND17 to NAND24. Moreover, since node N18 is "1", node N22 is "0", and DQSW11 is "1" (ON) by NOR21. In other words, DQ3 is replaced with DSQ1, and IO0 and SDQ1 are connected. Then, IO1 and DQ11 are connected by DQSW11.

(b) Case in which the respective addresses belong to DQ3 and DQ15, respectively, and the address signal corresponding to DQ15 is given:

As explained in item (1)–(c), even if the address signal (A0="1", A1="1", A2="1") corresponding to DQ15 is given, DQSW7 is turned on and DQ7 and IO0 are connected since IO0 is not related to the fuse. Next, at IO1, only N20 is "0" among nodes N17 to N20. Therefore, the gate output SDQSW7 of NOR17 is "1" (ON). Also, since the address signal is A1="1", A2="1", only N28 is "0" among nodes N25 to N28. Therefore, the gate output SDQW7 of NOR17 is "1" (ON). In this case, since node N20 is "0", node N24 is "1" and the outputs of NOR24 and NOR25 are "0." Therefore, DQSW14 and DQSW15 are "0" (OFF). In other words, data transmission to IO1 is achieved by connecting SDQ3 and IO0 by the control of SDQSW7.

(c) Case in which each of the defective addresses belongs to each of DQ3 and DQ15 and the address signal which is different from DQ3 and DQ15, is given:

In this case, the following will explain a case in which the address signal (A0="0", A1="0", A2="0") is given:

The ON/OFF relation of the switch circuit of IO0 of FIG. 12 will be explained. Since all nodes N5 to N8 are "1" and only N13 is "0" among N13 to 15, and A0="0", the gate output of NAND5 is "0." Also, since node N5 is "1", node N9 is "0", and DQSW0 is "1" (ON).

Next, the ON/OFF relation of the switch circuit of IO0 of FIG. 13 will be explained. Since all nodes N17 to N2 are "1" and only N25 is "0" among N25 to N28, and A0="0", the gate output of NAND17 is "0." Also, since node N17 is "1", node N21 is "0", and DQSW8 is "1" (ON). In other words, node SDQ1 and SDQ3 are not used, the switch circuit for connecting the pair of DQ lines corresponding to the given address to IO, is turned on.

The above showed only the replacement with SDQ1 and SDQ3. However, the replacement with the other SDQ may be executed. Also, particularly, four pairs of SDQ lines have relation with 64 pairs of DQ lines to replace the defective address. However, as explained above, four pairs of SDQ lines have relation with 256 pairs of DQ lines, and four pairs of SDQ can be replaced with an arbitrary pairs of DQ lines.

Figure 14:
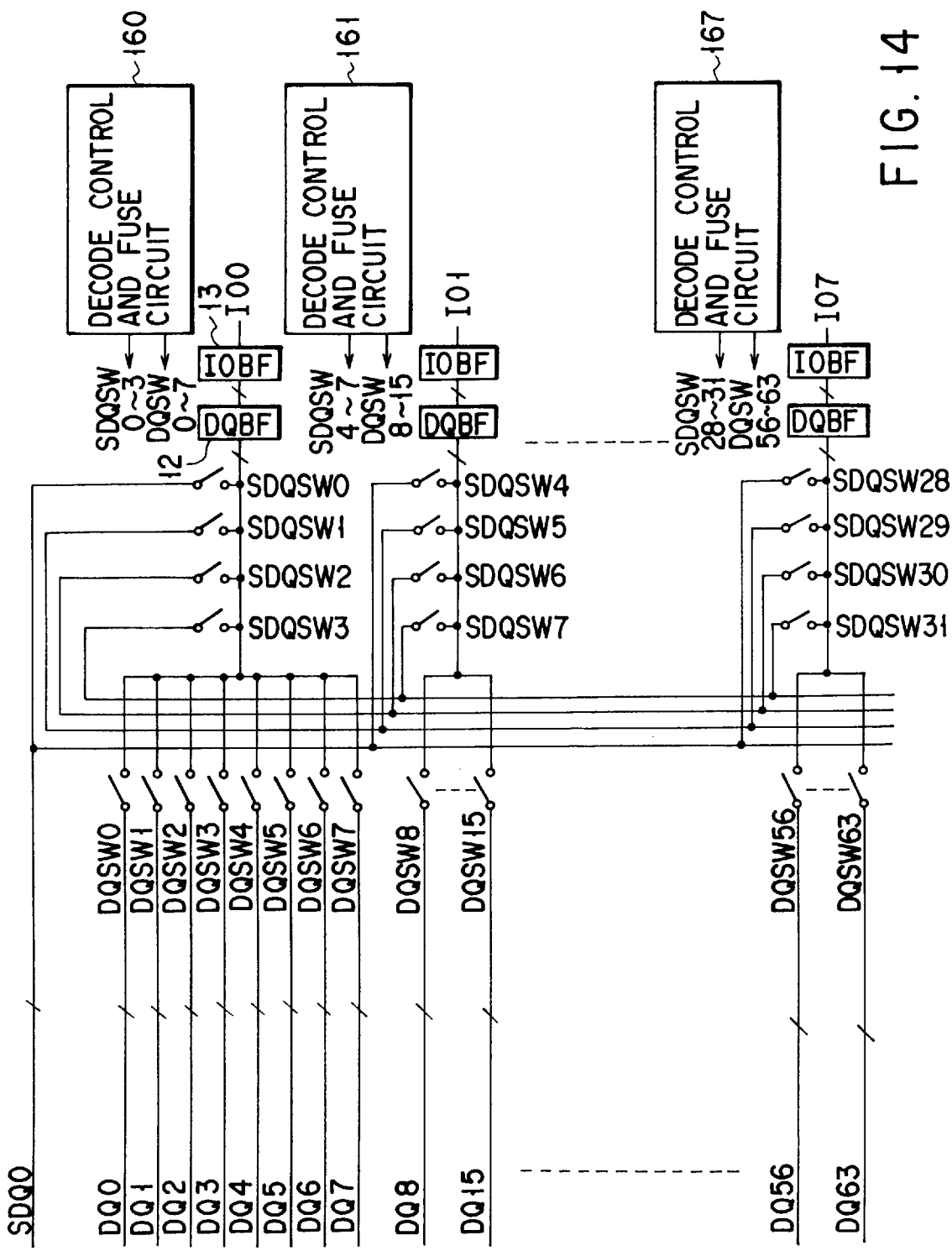
FIG. 14 is a conceptional view showing the relationship between 64 pairs of DQ lines (DQ0 to 63) and four SDQ lines in the semiconductor memory device of the overlaid-DQ system according to a third embodiment of the present invention.

FIG. 14 is a view relating to the semiconductor memory device of the overlaid-DQ system according to a third embodiment of the present invention. In other words, FIG. 14 is a conceptional view showing that the relationship between 64 pairs of DQ lines (DQ0 to DQ63) and four SDQ lines is extracted in a state that the layout of the spare circuits 111 to 113 of FIG. 3 is used based on the second embodiment. More specifically, as compared the cases of FIGS. 10 and 11, the arrangement of the spare columns is only dispersed as in the first embodiment, so that the substantial circuit is the same as the cases of FIGS. 12 and 13.

Figure 15:
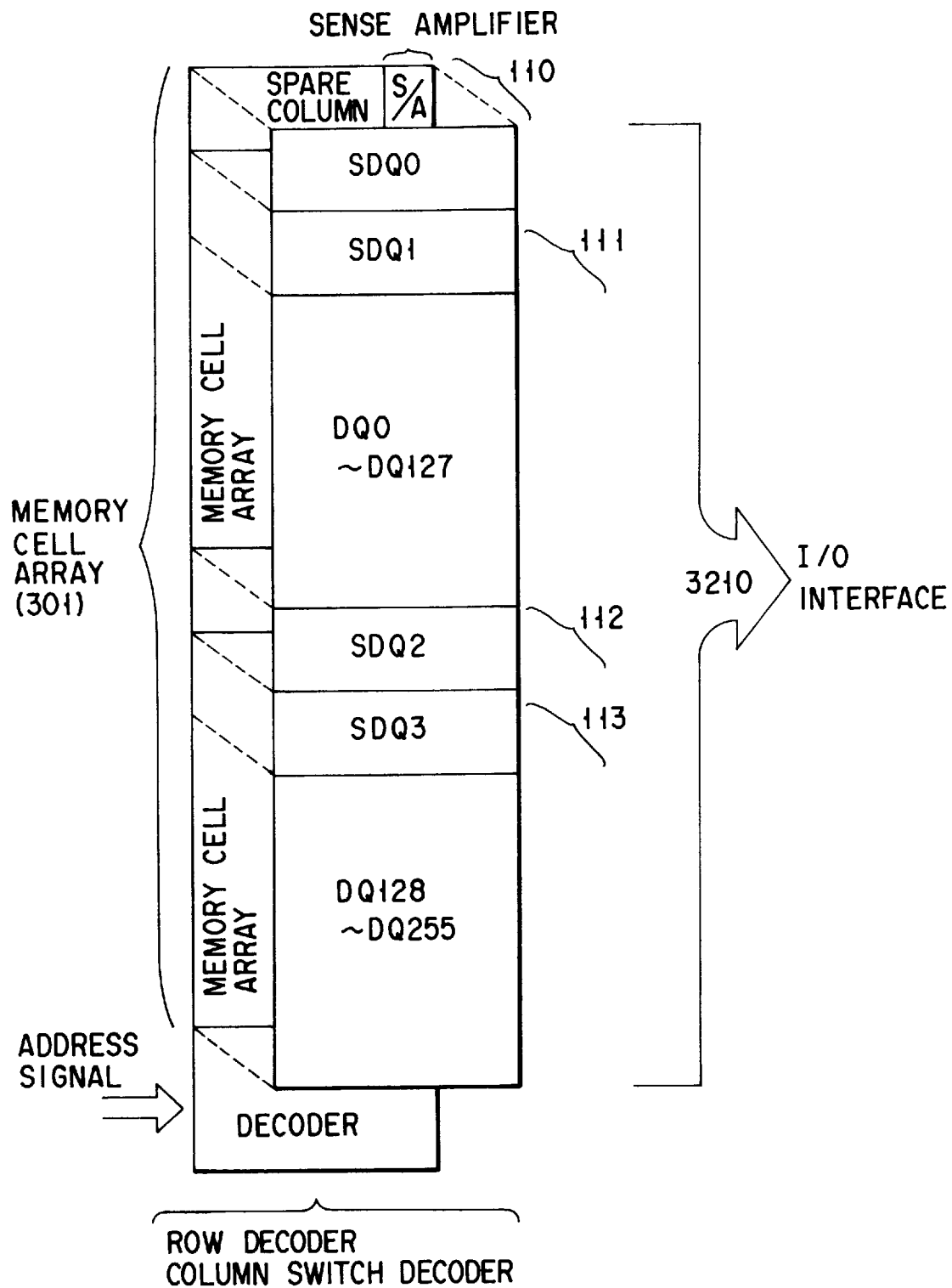
FIG. 15 is a block diagram showing the arrangement of the spare columns in the semiconductor memory device of the overlaid-DQ system according to a fourth embodiment of the present invention.

FIG. 15 is a block diagram showing the arrangement of the spare columns in the semiconductor memory device of the overlaid-DQ system according to a fourth embodiment of the present invention. In other words, the layout of the spare circuits 111 to 113 is changed based on the second embodiment.

Figure 16:
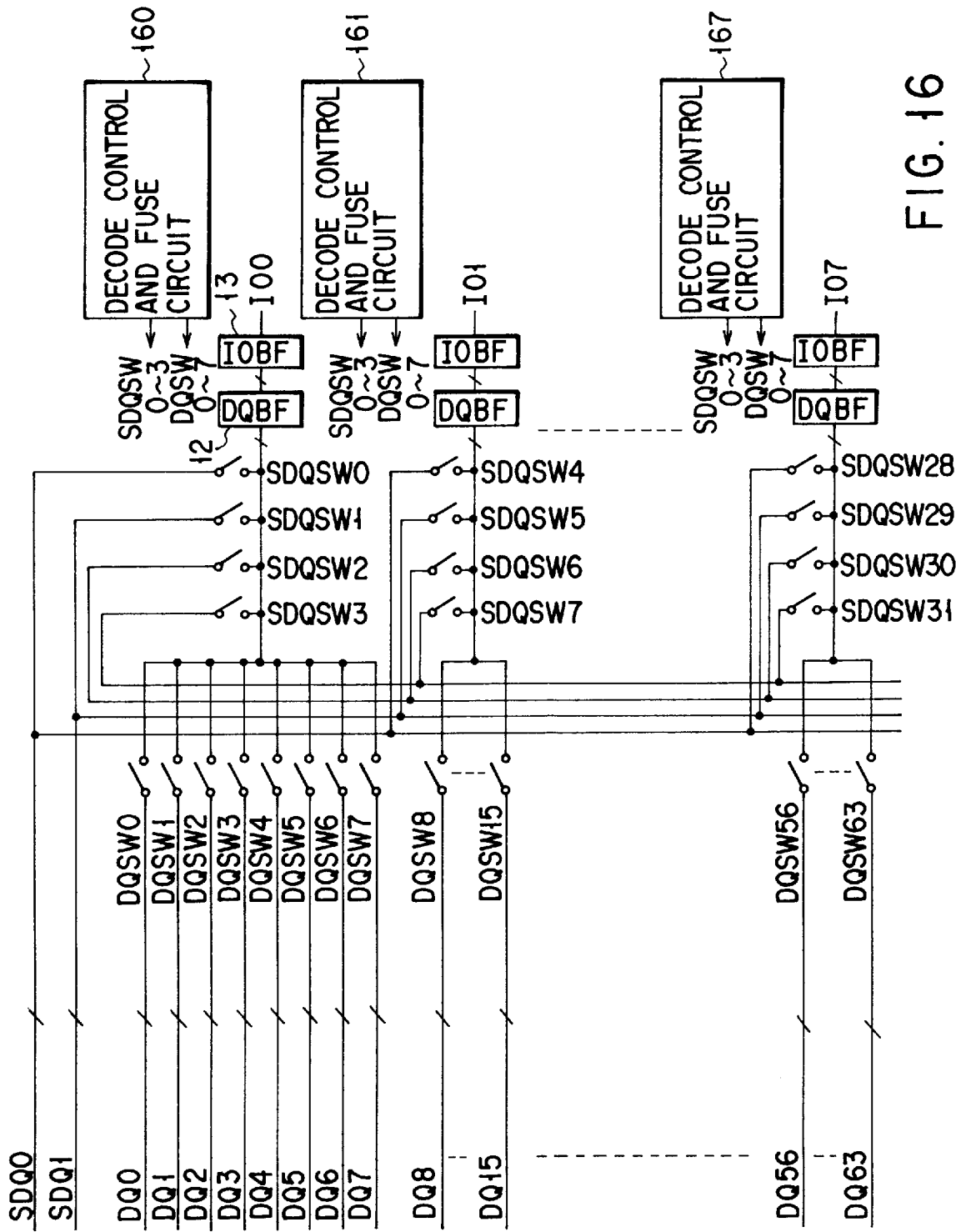
FIG. 16 is a basic conceptional view of the invention in which 64 pairs of DQ lines (DQ0 to DQ63) and four SDQ lines are extracted in connection with FIG. 15.

FIG. 16 is a basic conceptional view of the invention in which 64 pairs of DQ lines (DQ0 to DQ63) and four SDQ lines are extracted in connection with FIG. 15. In other words, as compared the cases of FIGS. 10 and 11, the arrangement of the spare columns is only dispersed as in FIG. 15, so that the substantial circuit is the same as the cases of FIGS. 12 and 13.

In the third and fourth embodiments, there is considered the point that the difference in the line delay is increased depending on the portion where the defectiveness occurs. Specifically, the third and fourth embodiments is structured such that the line delay on the real chip can be relatively reduced. In addition, depending on how the address is given, eight pairs of DQ lines, which are arranged per one IO, is divided into four by the circuit of FIG. 12 and FIG. 13. Then, four divided DQ lines can be replaced with SDQ0 to SDQ3. The above-explained replacement with SDQ is one example, and the arrangement of the address of the decode and the fuse is changeable.

Figure 17:
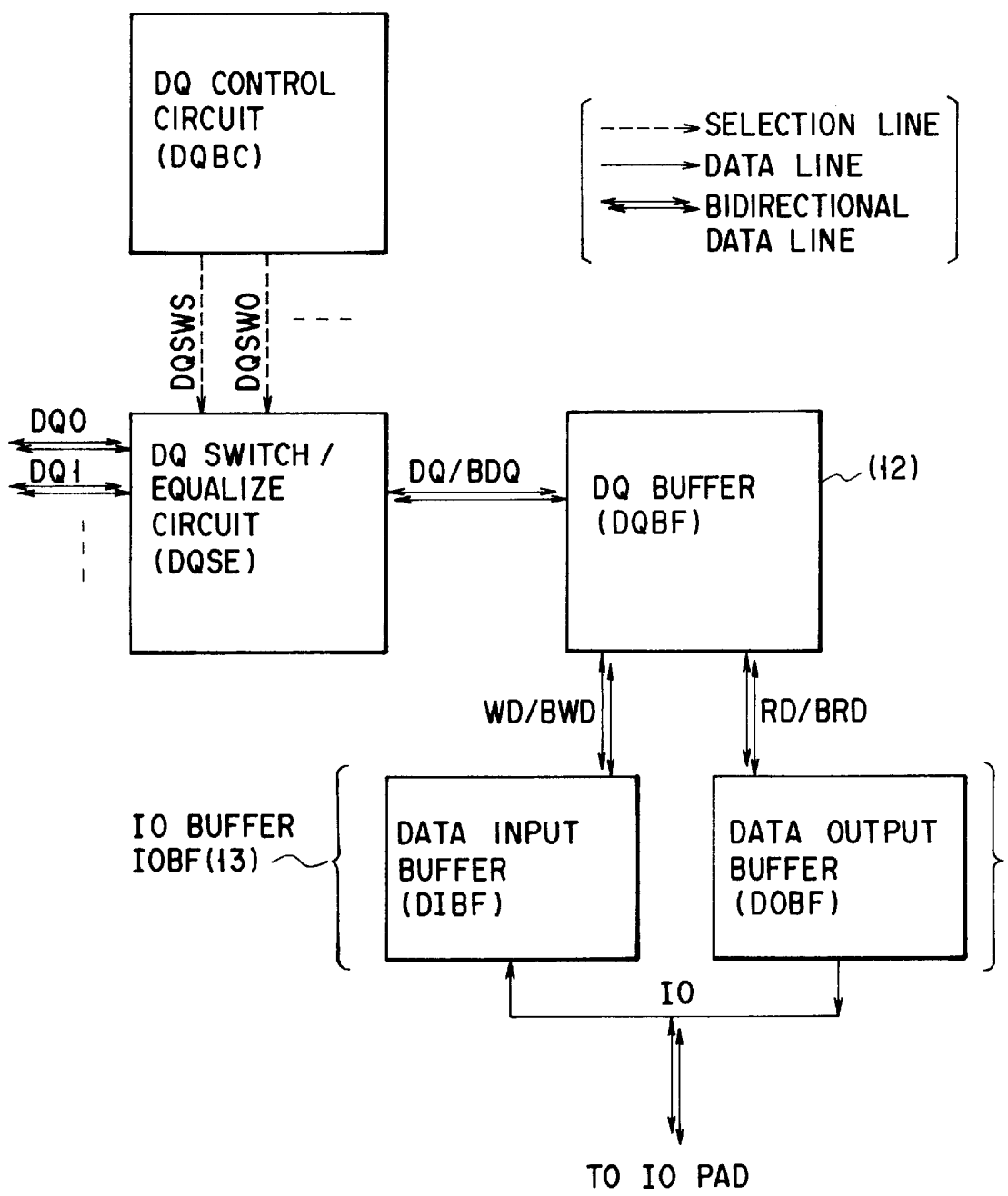
FIG. 17 is a block diagram showing a transmission path between the DQ line and the IO.

Each of FIGS. 17 to 22 is a block diagram showing a transmission path between the DQ line and the IO. FIG. 17 is a circuit diagram, and FIGS. 18 to 22 are specific diagrams each showing the block of FIG. 7.

In FIG. 17, a DQ switch/equalizer circuit DQSE is a circuit block of a switch section of eight pairs of DQ lines relating to one IO of FIG. 4. By the decode control of an address (not shown), a switch control signal DQSW (DQSWS) for controlling the selection of a pair of DQ lines (SDQ) is supplied to a DQ control circuit DQBC. The selected pair of DQ lines is electrically connected to DQ buffer DQBF. The DQ buffer DQBF generates read data RD/BRD or write data WD/BWD through the pair of DQ lines, and has relation with an IO buffer IOBF comprising a data output buffer DOBF and a data input buffer DIBF.

Figure 18:
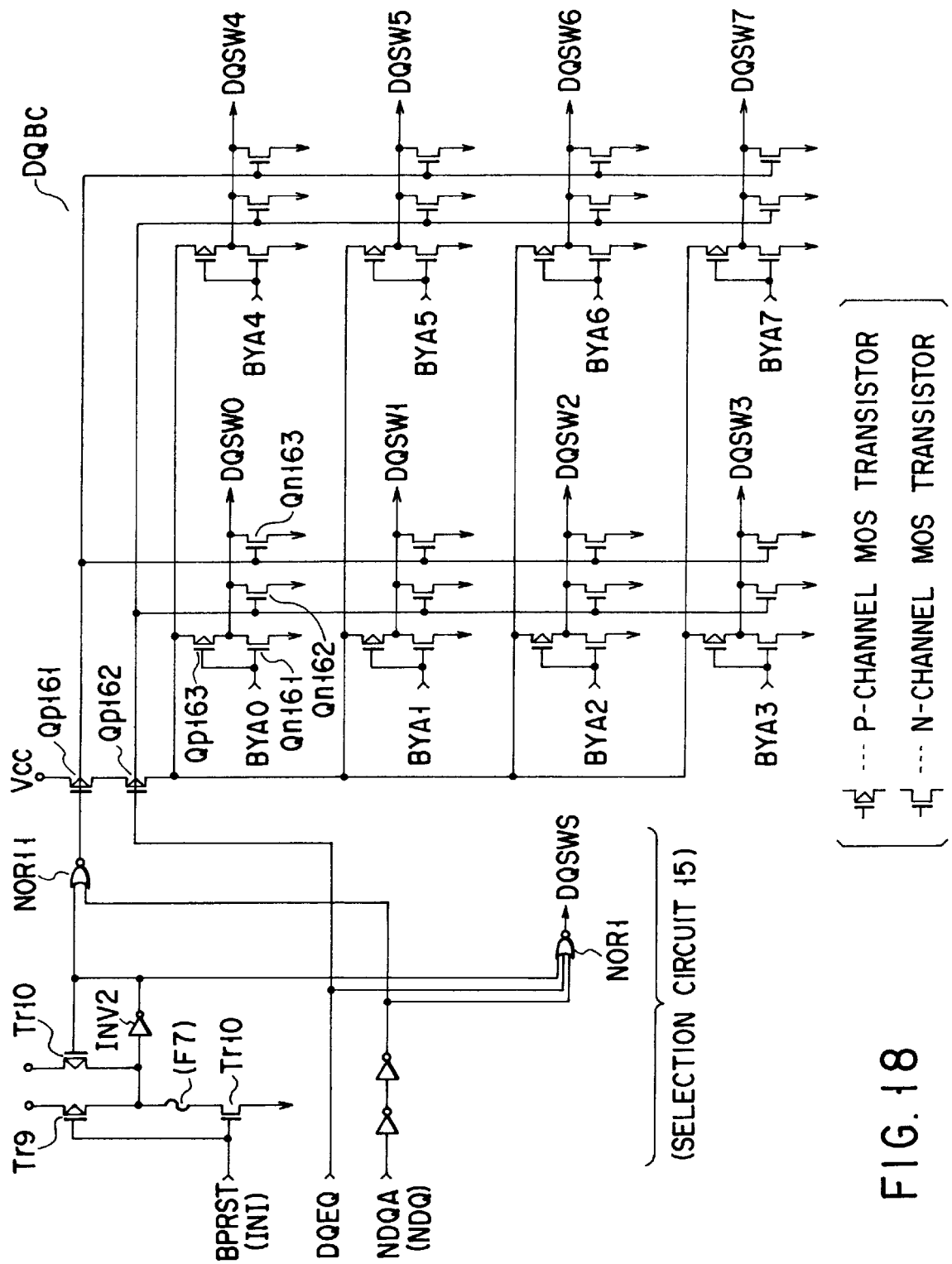
FIG. 18 is a first circuit diagram showing a part of FIG. 17.

FIG. 18 is a DQ control circuit DQBC, which includes the structure of the selection circuit 150 of FIG. 8 (the same reference numeral as FIG. 8 is added). A signal DQEQ is an equalize signal. BYA0 to BYA7 are selection signals in response to the decode control of FIG. 6. It is assumed that a signal NDQA (NDQ) is set to be an "L" (low) level (nonactive level) by the control of the fuse circuit of FIG. 7 and the fuse 7 of a selection circuit 15 is cut. The output of the NOR gate NOR 11 is set to be in a "H" (high) level (active level). Thereby, signals DQSW0 to 7 for transfer controlling the pair of DQ lines are set to the "L" level, and the signals DQSWS are set to the "H" level.

Figure 19:
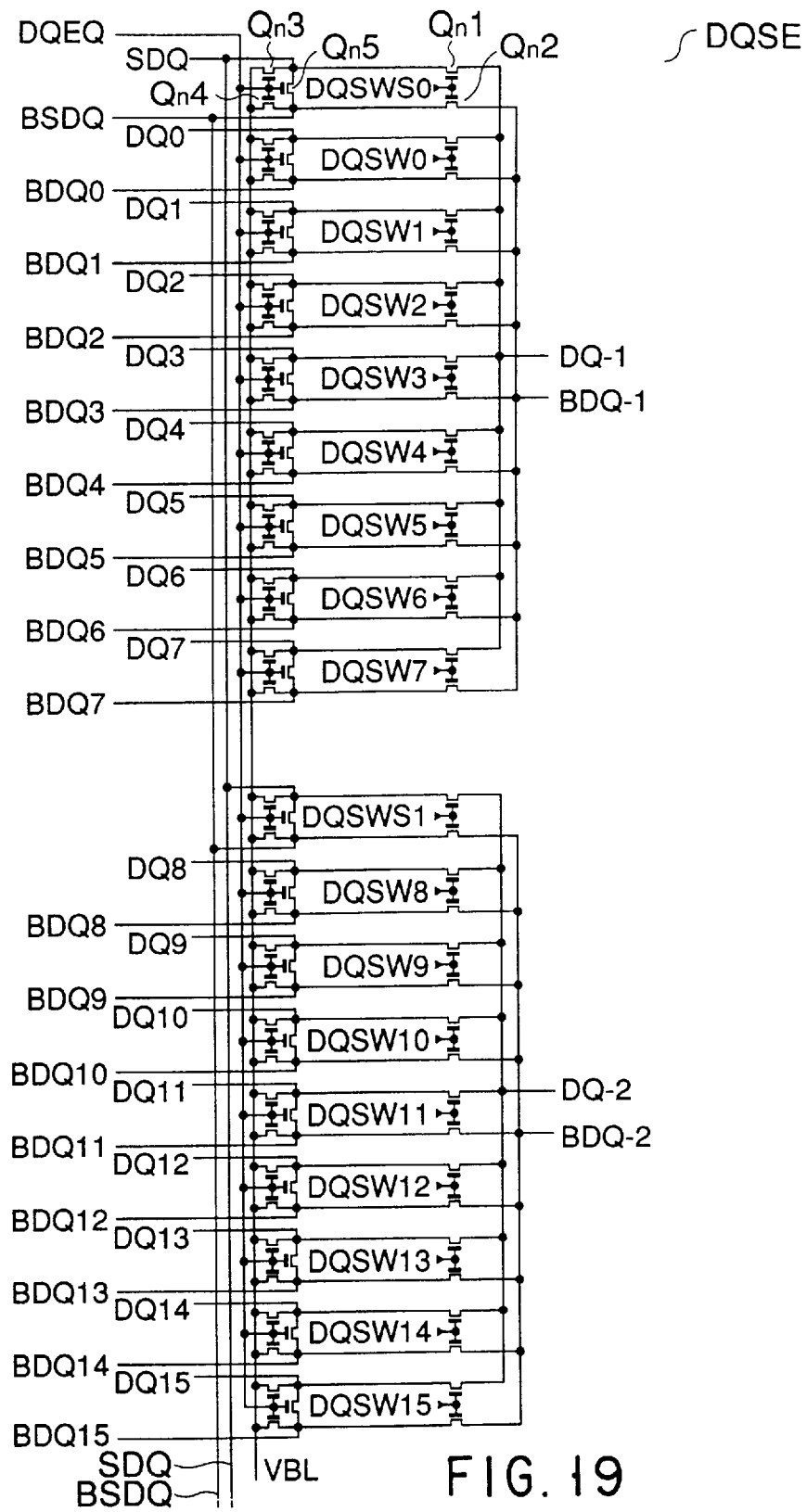
FIG. 19 is a second circuit diagram showing a part of FIG. 17.

FIG. 19 is a DQ switch/equalizer circuit DQSE. A switch circuit (the same as FIG. 5), which comprises N-channel MOS transistors Qn1, Qn2, is provided every pair of DQ lines and every pair of spare DQ lines. In this figure, the respective switch circuits are controlled by signals DQSW0, 1, 2, . . . and signals DQSW0, 1. Then, the switch circuits transfer control the pair of DQ lines or the pair of DQ lines.

Also, the equlizier circuit, which comprises N-channel MOS transistor Qn3 to Qn5, is provided every pair of DQ lines and every pair of spare DQ lines. Each equalizer circuit is controlled by the signal DQEQ. BVL is a predetermined bit line potential. SDQ and BSDQ, which are the pairs of spare DQ lines, are extended to be used in both a plurality of units each having eight pairs of DQ lines.

Figure 20:
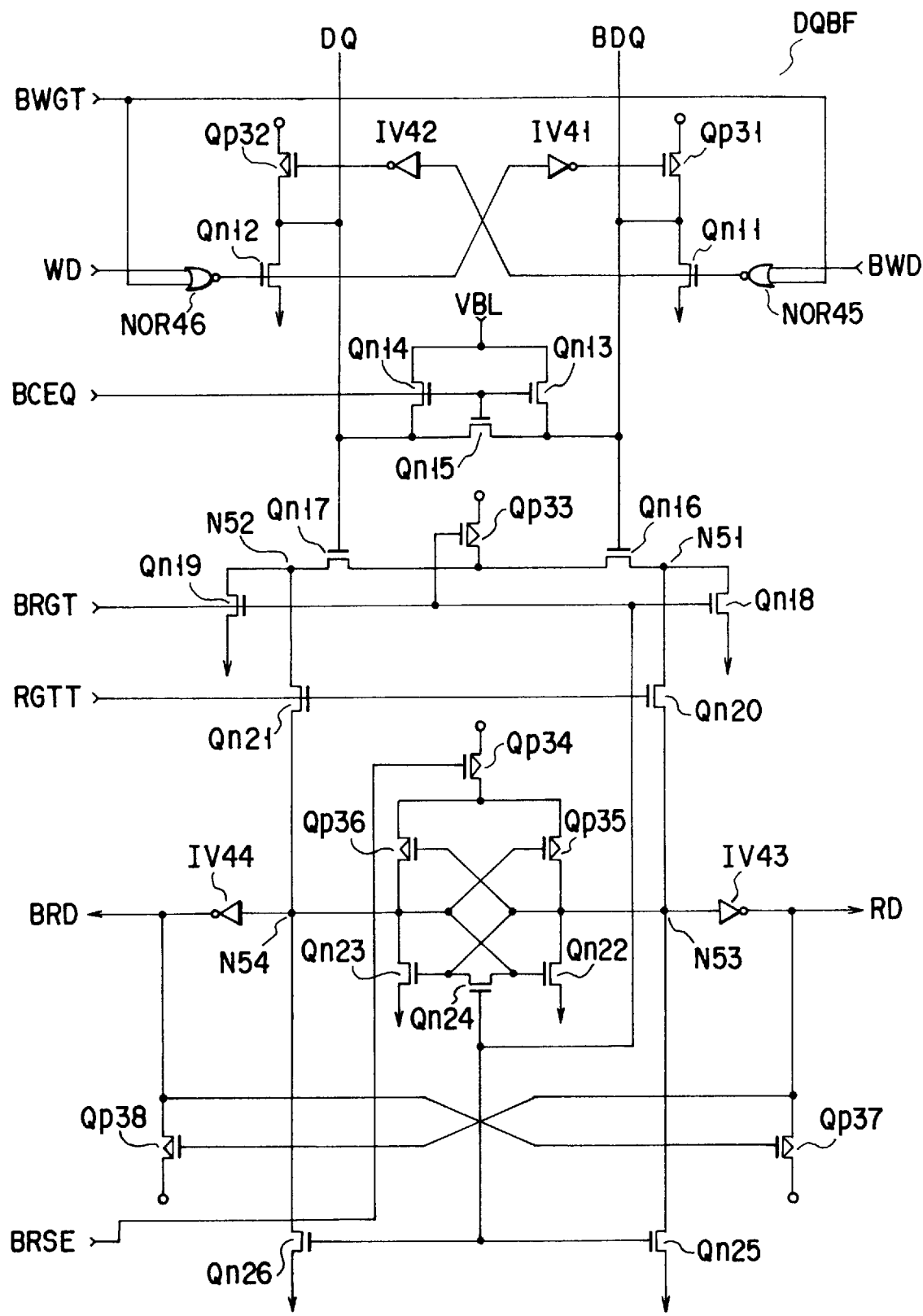
FIG. 20 is a third circuit diagram showing a part of FIG. 17.

FIG. 20 is a DQ buffer DQBF. Writing signals WD and BWD are transfer controlled by a signal BWGT to be transmitted to pairs of DQ lines DQ and BDQ. In other words, P-channel MOS transistor Qn 32 and 31 complementarily supply a power voltage to the pairs DQ lines in response to the outputs of NOR gate NORs 45 and 46. Transistors Qn13 to 15 are equalize circuits, which are controlled by a signal BCEQ. Each of the equilize circuits equalizes the pair of DQ lines to a predetermined potential BVL.

N-channel MOS transistors Qn 16 and 17 receive signals of DQ lines and BDQ lines at their gates to be on/off controlled. A P-channel MOS transistor Qp33 is gate controlled by a signal BRGT to flow a current to either the transistor Qn16 or Qn17, which is turned on. N-channel MOS transistors Qn18 and 19 are gate controlled by the signal BRGT, and resets nodes N51 and 52 to a ground potential at an activation time. Transistors Qn20 and 21 are gate controlled by a signal RGTT so that the potentials nodes N51 and N52 and those of nodes 53 and 54 are electrically connected to each other or disconnected from each other.

P-channel MOS transistors Qp34 to Qp36 and N-channel MOS transistors Qn22 to 24 are sense amplifiers each comprising a differential amplifier. These sense amplifiers are enable controlled by a signal BRSE. These sense amplifiers amplify complementary signals, which are transmitted when the transistors Qn20 and Qn21 are turned on. A transistor Qn24 is gate controlled by a signal BRGT so as to reset the latch state of the sense amplifiers. Transistors Qn25 and Qn26 are gate controlled by the signal BRGT so as to reset nodes N53 and N54 to a ground potential. Transistors Qp37 and Qp38 are provided to supply the power voltage to a read output RD or BRD.

Figure 21:
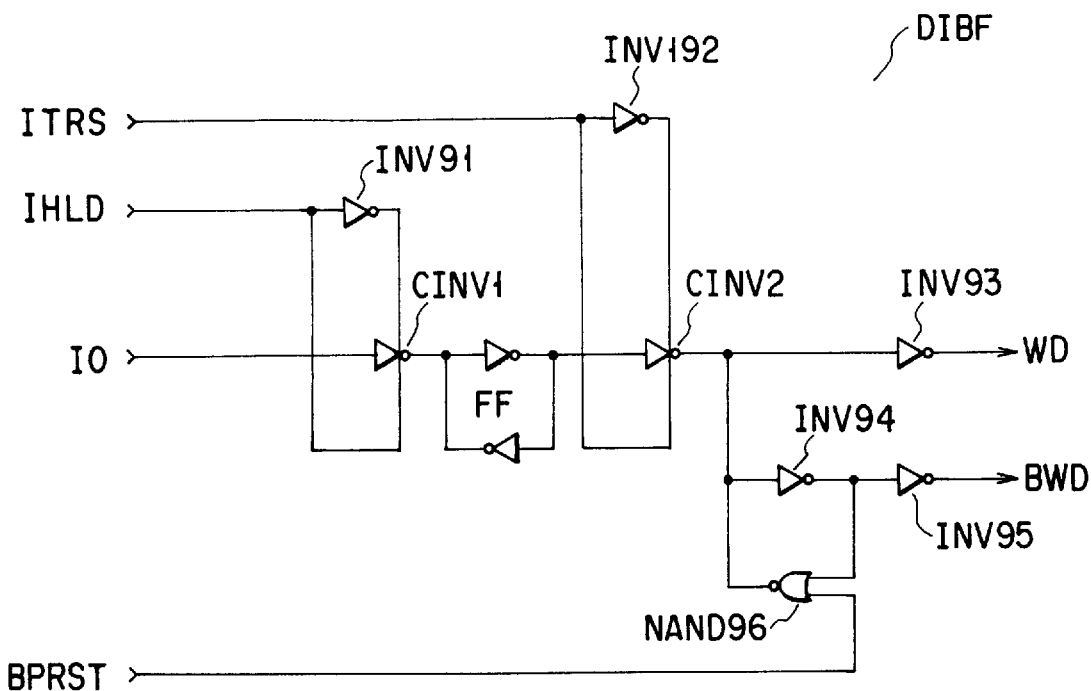
FIG. 21 is a fourth circuit diagram showing a part of FIG. 17.

FIG. 21 is a data input buffer DIBF in the IO buffer (IOBF). Input signals from IO are output as write signals QD, BWD through a clocked inverter CINV1, which is controlled by a signal IHRD, a flip-flop FF, and a clocked inverter CINV2, which is controlled by a signal ITRS. The write signals WD and BWD are transmitted to the pair of DQ lines DQ and the pair of DQ lines BDQ by the DQ buffer DQBT of FIG. 20. INVs 91 to 95 are inverters for a signal reversion, and a NAND 96 is a NAND gate at which the reversion of an output signal of INV 94 is controlled.

Figure 22:
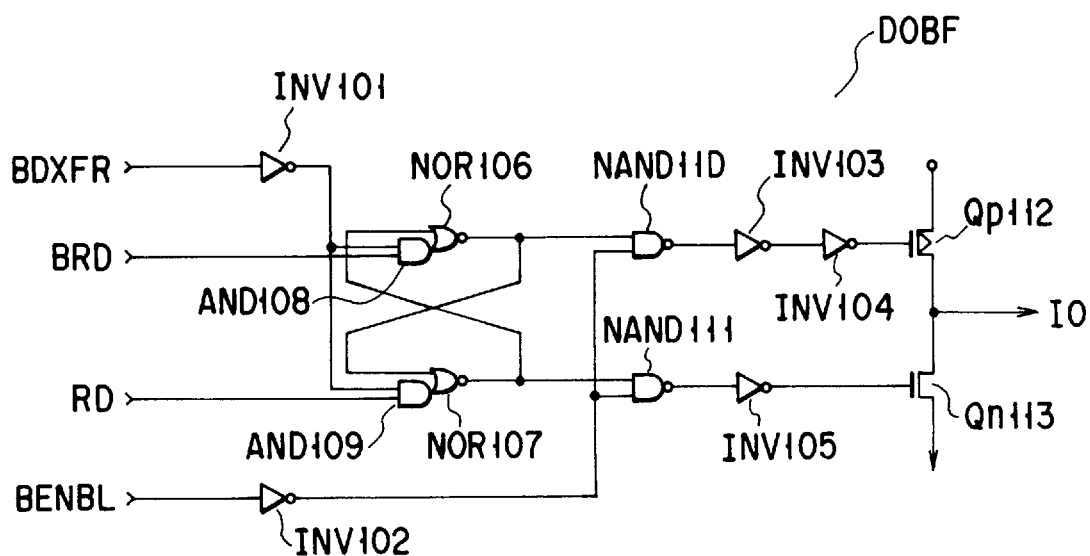
FIG. 22 is a fifth circuit diagram showing a part of FIG. 17.

FIG. 22 is a data output buffer DOBF in the IO buffer (IOBF). Data of the memory cell, which is passed through the pair of DQ lines, is used as read signals RD and BRD by the DQ buffer DQBF of FIG. 20. Read signals RD and BRD are passed through a latch circuit and NAND gates 110 and 111. The latch circuit, which comprises NOR gates 106 and 107, is controlled by a signal BDXFR. The NAND gates 110 and 111 are controlled by a signal BENBL. INV103 to 105 are inverters. An output stage comprises a P-channel MOS transistor Qp112, and an N-channel MOS transistor Qn113 to obtain an IO input.

Thus, the above embodiments variously showed the relationship between the spare DQ lines and IO. Specifically, the spare ciruicts can be freely laid out in the memory cell to be used in replacing the defective address. Also, the spare circuits can have an appropriate relation with the memory cell array to be used in replacing the defective address. Thereby, in the semiconductor memory device, the efficiency of the replacement of the defective cell is increased, so that improvement of yield can be expected.

Therefore, the degree of freedom of the layout can be increased so as to contribute to the reduction of the size of the chip. Thereby, there can be provided a semiconductor memory device having a redundancy technique, which is suitable to correspond to the overlaid-DQ system of the multi-bit I/O by effectively using the small number of spare columns if the rate of the address defectiveness is low.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

I claim:

1. A semiconductor memory device comprising:

a memory cell array baving memory cells ananged in a matrix form in row and column line directions;

spare columns having spare memory cells arranged in said memory cell array;

a decoder for decoding an address for reading and writing data of said memory cell array;

a plurality of pairs of data lines, having the same direction as the column line direction at an upper portion of said memory cell array and having a first metal line layer placed at the upper position, electically connected to said memory cell array;

a plurality of pairs of signal lines for transmitting signals of a predetermined number pairs of data lines having an address partially common to said plurality of pairs of data lines;

a first pair of parallel lines arranged in the row line direction to guide said predetermined number of pairs of data lines, said first pair of parallel lines having a second metal line layer placed at the upper position that the column line and a lower position than first metal line layer;

a pair of spare data lines having the same direction as the column line direction at the upper portion of said spare columns and said first metal line layers said pair of spare data lines electrically connected to said spare memory cell to be replaced with said pairs of data lines;

a second pair of parallel lines having said second metal line layer to guide said pairs of spare data lines to said each pair of signal lines;

a control circuit for storing an address of a specific pair of data lines for transmitting defective data in said memory cell array so that an outer address signal is input, said control circuit for transmitting a control signal for selecting any one of said pairs of data lines, corresponding to the outer address signal, and said pairs of spare data; and a switch circuit electrically connected between said memory cell array and said pairs of signal lines in response to said outer address signal by controlling the selection of the pairs of spare data corresponding to said outer address having no replacement with said pairs of spare data lines and the pairs of data ines corresponding to said outer address replaced with the pairs of data lines based on said control signal.

2. The semiconductor memory device according to claim 1, wherein said spare columns are provided in said memory cell array one by one every memory cell portion selected by an aribitrary address bit, and said pairs of spare data lines are provided at the upper portion of the memory cell array one by one every memory cell portion selected by an aribitrary address bit.

3. The semiconductor memory device according to claim 1, wherein said spare columns are provided in said memory cell array in plural numbers every memory cell portion selected by an aribitrary address bit, and said pairs of spare data lines are provided at the upper portion of the memory cell array in plurality numbers every memory cell portion selected by an arbitrary address bit.

4. The semiconductor memory device according to claim 1, wherein said spare columns are provided in said memory cell array in their collective unit, and said pairs of spare data lines are provided at the upper portion of the memory cell array in their collective unit.

5. The semiconductor memory device according to any one of claims 2 to 4, wherein said spare columns and said pairs of spare data lines are formed such that said second pair of parallel lines is shared with the respective pairs of spare data lines, and said spare columns and said pairs of spare data lines are formed such that said second pair of parallel lines is shared with all portions of said memory cell array.

6. The semiconductor memory device according to any one of claims 2 to 4, wherein said spare columns and said pairs of spare data lines are formed such that said second pair of parallel lines is shared with a plurality of pairs of spare data lines, and said spare columns and said pairs of spare data lines are formed such that said second pair of parallel lines is shared with a plurality of parts of said memory cell array.

7. The semiconductor memory device according to claim 1, wherein said control circuit includes a first control circuit for storing the address of the pair of data lines for transmitting defective data in said memory cell array, and a second control circuit for selecting one of said plurality of pairs of signal lines where the address belongs.

8. The semiconductor memory device according to claim 7, wherein one first control circuit is provided every predetermined number of pairs of signal lines, and said second control circuit is provided one by one to correspond to each of said plurality of pairs of signal lines.

9. The semiconductor memory device according to claim 1, wherein said control circuit includes a first circuit section for storing the address of the pair of data lines for transmitting defective data in said memory cell array and detecting the storing state in accordance with the outer address signal, and a second circuit section, controlled by a detection output from said first circuit section and a signal for selecting the pair of the data lines corresponding to the outer address, for generating said control signal for selecting one pair of data lines corresponding to said pair of signal lines where the address belongs or one pair of spare data lines.

10. The semiconductor memory device according to claim 9, wherein said control circuit is provided one by one to correspond to each of said plurality of pairs of signal lines.

11. A semiconductor memory device comprising:

a memory cell array having memory cells arranged in a matrix form in row and column line directions;

spare columns having spare memory cells arranged in said memory cell array;

a decoder for decoding an address for reading and writing data of said memory cell array;

a plurality of pairs of data lines, having the same direction as the column line direction at an upper portion of said memory cell array and having a first metal line layer placed at the upper position, electrically connected to said memory cell array;

a plurality of pairs of signal lines for transmitting signals of a predetermined number pairs of data lines having an address partially common to said plurality of pairs of data lines;

a pair of spare data lines having the same direction as the column line direction at the upper portion of said spare columns and said first metal line layer, said pair of spare data lines electrically connected to said spare memory cell to be replaced with said pairs of data lines;

a line path, having the same direction as the row line direction, for electrically connecting said pairs of spare data lines to each pair of signal lines;

a control circuit for storing an address of a specific pair of data lines for transmitting defective data in said memory cell array so that an outer address signal is input, said control circuit for transmitting a control signal for selecting any one of said pairs of data lines, corresponding to the outer address signal, and said pairs of spare data; and a switch circuit electrically connected between said memory cell array and said pairs of signal lines in response to said outer address signal by controlling the selection of the pairs of spare data corresponding to said outer address having no replacement with said pairs of spare data lines and the pairs of data lines corresponding to said outer address replaced with the pairs of data lines based on said control signal.

12. The semiconductor memory device according to claim 11, wherein said memory cells constitute DRAM memory cells.

13. The semiconductor memory device according to claim 11, wherein said spare columns are provided one by one every memory cell portion selected by an arbitrary address bit in said memory cell array, and said pairs of spare data lines are provided one by one every memory cell portion selected by an arbitrary address bit at the upper portion of the memory cell array.

14. The semiconductor memory device according to claim 11, wherein said spare columns are provided in said memory cell array in plural numbers every memory cell portion selected by an arbitrary address bit, and said pairs of spare data lines are provided at the upper portion of the memory cell array in plurality numbers every memory cell portion selected by an arbitrary address bit.

15. The semiconductor memory device according to claim 11, wherein said spare columns are provided in said memory cell array in their collective unit, and said pairs of spare data lines are provided at the upper portion of the memory cell array in their collective unit.

16. The semiconductor memory device according to any one of claims 13 to 15, wherein said spare columns and said pairs of spare data lines are formed such that said second pair of parallel lines is shared with the respective pairs of spare data lines, and said spare columns and said pairs of spare data lines are formed such that said second pair of parallel lines is shared with all portions of said memory cell array.

17. The semiconductor memory device according to any one of claims 13 to 15, wherein said spare columns and said pairs of spare data lines are formed such that said second pair of parallel lines is shared with a plurality of pairs of spare data lines, and said spare columns and said pairs of spare data lines are formed such that said second pair of parallel lines is shared with a plurality of parts of said memory cell array.

18. The semiconductor memory device according to claim 11, wherein said control circuit includes a first control circuit for storing the address of the pair of data lines for transmitting defective data in said memory cell array, and a second control circuit for selecting one of said plurality of pairs of signal lines where the address belongs.

19. The semiconductor memory device according to claim 18, wherein one first control circuit is provided every predetermined number of pairs of signal lines, and said second control circuit is provided one by one to correspond to each of said plurality of pairs of signal lines.

20. The semiconductor memory device according to claim 11, wherein said control circuit includes a first circuit section for storing the address of the pair of data lines for transmitting defective data in said memory cell array and detecting the storing state in accordance with the outer address signal, and a second circuit section, controlled by a detection output from said first circuit section and a signal for selecting the pair of the data lines corresponding to the outer address, for generating said control signal for selecting one pair of data lines corresponding to said pair of signal lines where the address belongs or one pair of spare data lines.

21. The semiconductor memory device according to claim 20, wherein said control circuit is provided one by one to correspond to each of said plurality of pairs of signal lines.

22. A semiconductor memory device comprising:

a memory cell array having memory cells arranged in a matrix form in row and column line directions;

a spare column having spare memory cells arranged in said memory cell array, a decoder for decoding an address for reading and writing data of said memory cell array;

a first set of data lines in a first metal layer, said first set of data lines arranged parallel to said row line direction;

a first set of spare data lines in said first metal layer, said first set of spare data lines arranged parallel to said row line direction;

a second set of data lines in a second metal layer, said second set of data lines arranged parallel to said column line direction, said second set of data lines electrically connecting said first set of data lines to said memory cell array;

a second set of spare data lines in said second metal layer, said second set of spare data lines arranged parallel to said column line direction, said second set of data lines electrically connecting said first set of spare data lines to said spare column;

a control circuit for storing an address of a specific pair of data lines connected to a defective memory cell so that when an outer address signal is input, said control circuit transmits a control signal that selects for connection any one of said pairs of data lines corresponding to the outer address signal, and said spare data lines; and a switch circuit electrically connecting said memory cell array and said data lines in response to said control signal, said switch circuit selecting said spare data lines corresponding to said outer address having no replacement with said spare data lines and selecting said data lines corresponding to said outer address to be replaced with said data lines based on said control signal.

* * * * *

UNITED STATES PATENT AND TRADEMARK OFFICE
CERTIFICATE OF CORRECTION

PATENT NO.: 5,892,719

DATED: April 6, 1999

INVENTOR: Naoaki Kanagawa

It is certified that error appear in the above-identified patent and that said Letters Patent is hereby corrected as shown below:

Title page, in the title, insert --TO-- before the word "DRAM."

and Col. 1, line 2.

Signed and Sealed this

Twenty-fourth Day of August, 1999

Attest:

Q. TODD DICKINSON

*Attesting Officer*  *Acting Commissioner of Patents and Trademarks*